(12) United States Patent
Tashiro et al.

(10) Patent No.: US 10,027,915 B2
(45) Date of Patent: Jul. 17, 2018

(54) PHOTOELECTRIC CONVERSION DEVICE AND IMAGING SYSTEM

(71) Applicant: CANON KABUSHIKI KAISHA, Tokyo (JP)

(72) Inventors: Kazuaki Tashiro, Isehara (JP); Noriyuki Kaifu, Hachioji (JP); Hidekazu Takahashi, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 130 days.

(21) Appl. No.: 14/794,695

(22) Filed: Jul. 8, 2015

(65) Prior Publication Data

US 2016/0035920 A1 Feb. 4, 2016

(30) Foreign Application Priority Data

Jul. 31, 2014 (JP) .................................. 2014-156791

(51) Int. Cl.

| H01L 31/062 | (2012.01) |
|---|---|
| H04N 5/3745 | (2011.01) |
| H04N 5/357 | (2011.01) |
| H04N 5/359 | (2011.01) |
| H04N 5/374 | (2011.01) |
| H01L 27/146 | (2006.01) |

(52) U.S. Cl.
CPC ... *H04N 5/37452* (2013.01); *H01L 27/14603* (2013.01); *H01L 27/14612* (2013.01); *H01L 27/14665* (2013.01); *H01L 27/14694* (2013.01); *H01L 27/14696* (2013.01); *H04N 5/3575* (2013.01); *H04N 5/3597* (2013.01); *H04N 5/374* (2013.01); *H04N 5/3745* (2013.01)

(58) Field of Classification Search
CPC .................................................. H01L 27/14696
USPC .................................................. 257/294, 444
See application file for complete search history.

(56) References Cited

U.S. PATENT DOCUMENTS 7,476,904 B2 * 1/2009 Fukunaga ......... H01L 27/14647
257/79
8,670,054 B2 * 3/2014 Takizawa .......... H01L 27/14627
348/222.1

(Continued)

FOREIGN PATENT DOCUMENTS

| CN | 1251329 C | 4/2006 |
| EP | 1267411 A2 | 12/2002 |

(Continued)

OTHER PUBLICATIONS

Chu-Hsuan, et al., "Metal-Insulator-Semiconductor Photodetectors", Sensors, vol. 2010, No. 10, pp. 8797-8826, Sep. 28, 2010, ISSN 1424-8220, www.mdpi.com/journal/sensors.

*Primary Examiner* — Chandra Chaudhari
(74) *Attorney, Agent, or Firm* — Canon USA, Inc. I.P. Division

(57) ABSTRACT

A photoelectric conversion device according to an exemplary embodiment includes a pixel which includes a photoelectric conversion unit and an amplifier transistor configured to output a signal generated by the photoelectric conversion unit. The photoelectric conversion unit includes a first electrode, a second electrode electrically connected to the amplifier transistor, a photoelectric conversion layer, and an insulating layer disposed between the photoelectric conversion layer and the second electrode. The photoelectric conversion layer includes quantum dots.

27 Claims, 22 Drawing Sheets

(56) References Cited

U.S. PATENT DOCUMENTS

| | | |
|---|---|---|
| 9,571,768 B2* | 2/2017 | Tashiro ................ H04N 5/3741 |
| 2009/0009638 A1 | 1/2009 | Koizumi |
| 2010/0187501 A1 | 7/2010 | Toda |
| 2011/0211103 A1 | 9/2011 | Sakano et al. |
| 2011/0279722 A1 | 11/2011 | Cieslinski et al. |
| 2012/0080675 A1* | 4/2012 | Nakatani ............... H01L 27/307 |
| | | 257/53 |
| 2012/0154656 A1 | 6/2012 | Oike et al. |
| 2013/0100330 A1 | 4/2013 | Yamada et al. |
| 2013/0222660 A1 | 8/2013 | Senda et al. |
| 2015/0108425 A1* | 4/2015 | Rosenman .......... H01L 29/0665 |
| | | 257/13 |
| 2016/0013328 A1 | 1/2016 | Tashiro et al. |
| 2016/0014364 A1 | 1/2016 | Tashiro et al. |

FOREIGN PATENT DOCUMENTS

| | | |
|---|---|---|
| JP | 2002350551 A | 12/2002 |
| JP | 2005-303284 A | 10/2005 |
| JP | 2010-206004 A | 9/2010 |
| JP | 2011-228621 A | 11/2011 |
| JP | 2012-182335 A | 9/2012 |
| JP | 2013-153050 A | 8/2013 |
| JP | 2014-078870 A | 5/2014 |
| RU | 2426195 C1 | 8/2011 |
| WO | 2012-004923 A1 | 1/2012 |
| WO | 2014049901 A1 | 4/2014 |

* cited by examiner

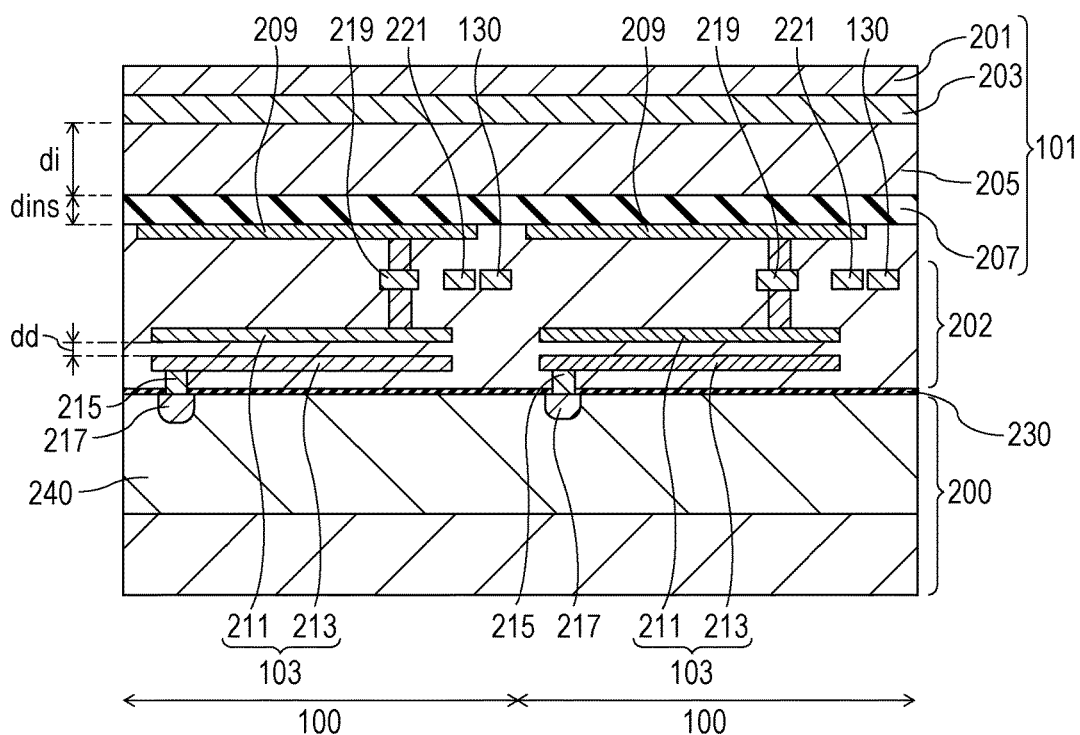
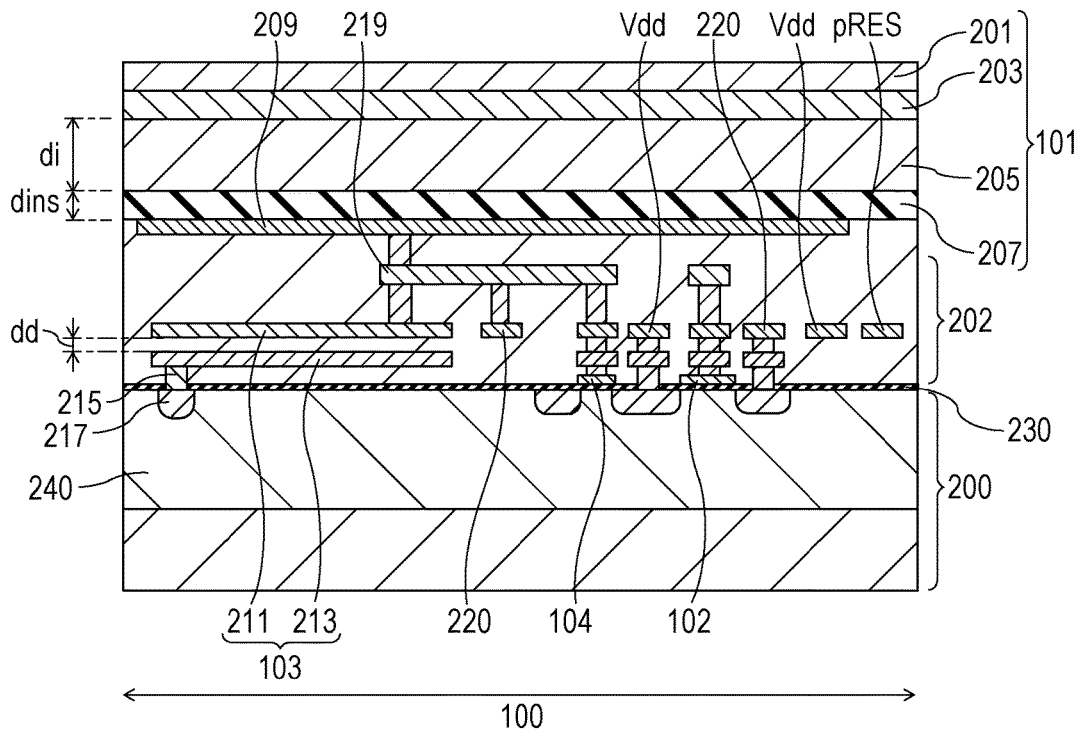

PHOTOELECTRIC CONVERSION DEVICE AND IMAGING SYSTEM

BACKGROUND OF THE INVENTION

Field of the Invention

The present disclosure relates to a photoelectric conversion device and an imaging system.

Description of the Related Art

Metal insulator semiconductor (MIS) photoelectric conversion devices have been proposed as photoelectric conversion devices used for image sensors of cameras. In a photoelectric conversion device illustrated in FIG. 1 in WO2012/004923 (hereinafter referred to as "Patent Literature 1"), a transparent electrode is disposed on top of a photoelectric conversion film, and a pixel electrode is disposed beneath the photoelectric conversion film. An insulating film is disposed between the photoelectric conversion film and the pixel electrode. Patent Literature 1 describes enabling of correlated double sampling with the configuration described above, achieving noise reduction.

Japanese Patent Laid-Open No. 2011-228621 (hereinafter referred to as "Patent Literature 2") discloses that a compound semiconductor, a silicon crystal, an ionic crystal, or the like is usable for a photoelectric conversion film. Patent Literature 2 describes a photoelectric conversion film formed of a material with a high optical absorption coefficient, such as amorphous silicon or an organic material. According to Patent Literature 2, the use of such a material leads to an increase in sensitivity.

SUMMARY OF THE INVENTION

A photoelectric conversion device according to an exemplary embodiment includes a pixel which includes a photoelectric conversion unit and an amplification unit configured to output a signal generated by the photoelectric conversion unit. The photoelectric conversion unit includes a first electrode, a second electrode, a photoelectric conversion layer disposed between the first electrode and the second electrode, and an insulating layer disposed between the photoelectric conversion layer and the second electrode. The photoelectric conversion layer includes quantum dots.

A photoelectric conversion device according to another exemplary embodiment includes a pixel which includes a photoelectric conversion unit and an amplification unit configured to output a signal generated by the photoelectric conversion unit. The photoelectric conversion unit includes a first electrode, a second electrode, a photoelectric conversion layer disposed between the first electrode and the second electrode, and an insulating layer disposed between the photoelectric conversion layer and the second electrode. The photoelectric conversion layer includes a first member, and a plurality of particles arranged in the first member and having a particle size in a range of 1 nm to 20 nm.

Further features of the present invention will become apparent from the following description of exemplary embodiments with reference to the attached drawings.

BRIEF DESCRIPTION OF THE DRAWINGS

FIGS. 5A and 5B are schematic diagrams of the cross-sectional structure of the photoelectric conversion device.

DESCRIPTION OF THE EMBODIMENTS

Some exemplary embodiments may reduce noise.

The photoelectric conversion film disclosed in Patent Literature 1 or Patent Literature 2 may include multiple defect energy levels. This may lead to noise in the photoelectric conversion device disclosed in Patent Literature 1 or Patent Literature 2.

For example, a dark current caused by a defect energy level may result in noise. The presence of a defect energy level makes it difficult to deplete a photoelectric conversion film. Thus, when a signal is read out from the photoelectric conversion film, the photoelectric conversion film may not sufficiently be depleted. As a result, electric charge that is not discharged from the photoelectric conversion film may remain in the photoelectric conversion film. An electric charge remaining in the photoelectric conversion film when a signal is read out from the photoelectric conversion film may cause noise in the signal to be output.

Accordingly, some exemplary embodiments provide a photoelectric conversion device capable of reducing noise.

Figure 1A:
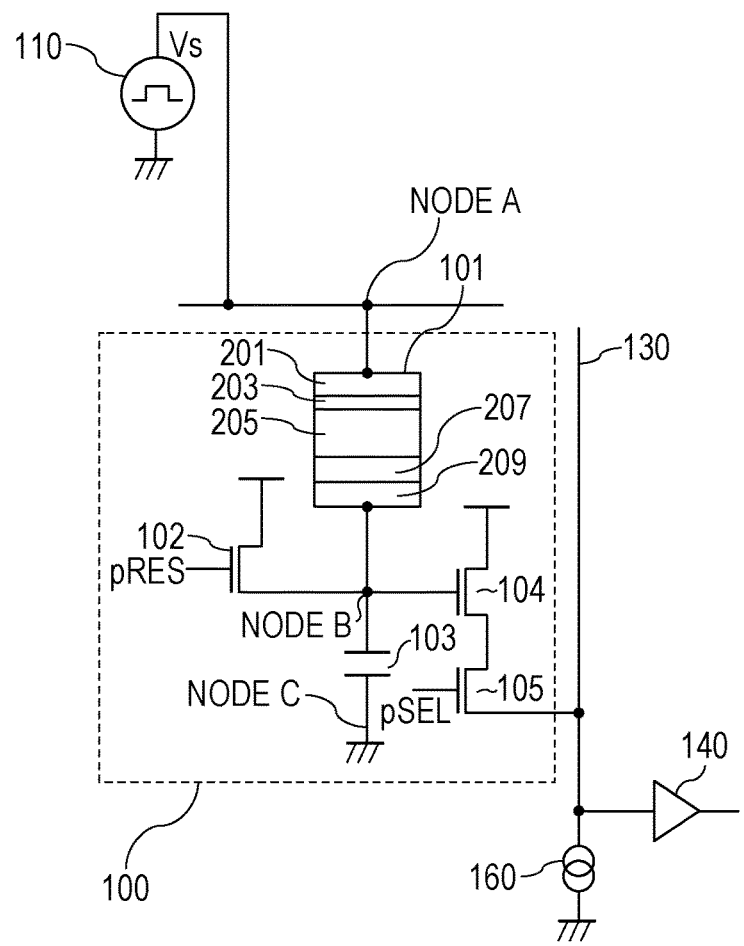
FIG. 1A is a schematic diagram of the configuration of a pixel of a photoelectric conversion device according to a first exemplary embodiment.

An embodiment of the present invention provides a photoelectric conversion device. A pixel included in the photoelectric conversion device includes a photoelectric conversion unit, and an amplification unit that amplifies a signal generated by the photoelectric conversion unit. The photoelectric conversion device may include a plurality of pixels. In this case, the photoelectric conversion device is, for example, an image sensor. Alternatively, the photoelectric conversion device may include a single pixel. In this case, the photoelectric conversion device is, for example, an optical sensor. In FIG. 1A, a pixel 100, a photoelectric conversion unit 101, and an amplifier transistor 104 are illustrated by way of example.

The photoelectric conversion unit includes a first electrode, a second electrode, a photoelectric conversion layer disposed between the first electrode and the second electrode, and an insulating layer disposed between the photoelectric conversion layer and the second electrode. This configuration enables the photoelectric conversion unit to accumulate electric charge generated by incident light as signal charge. Further, a signal from the photoelectric conversion unit can be read out by controlling the voltage to be supplied to a pixel circuit including the photoelectric conversion unit. In FIG. 1A, a first electrode 201, a photoelectric conversion layer 205, an insulating layer 207, and a second electrode 209 are illustrated by way of example.

Figure 21A:
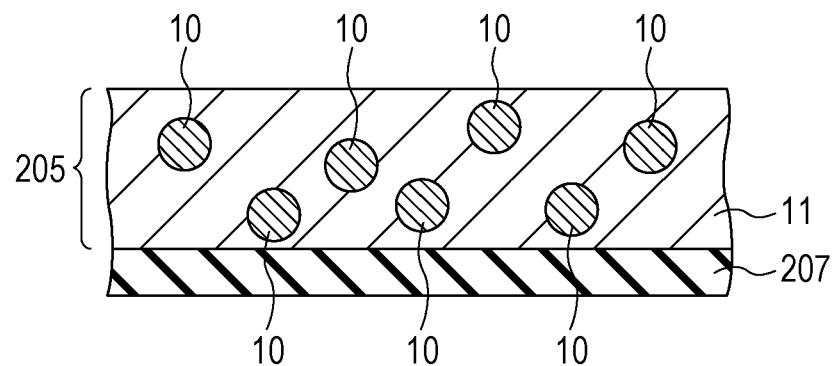
FIGS. 21A to 21C are schematic diagrams of the structure of a photoelectric conversion layer.
Figure 21B:
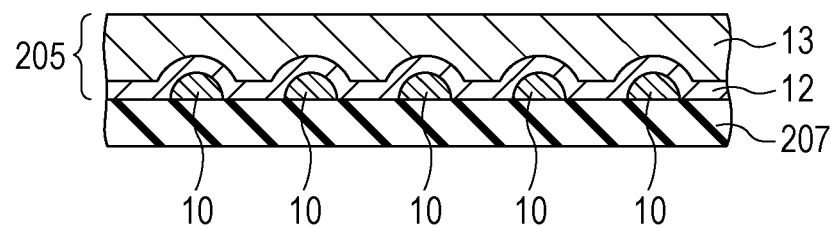
Figure 21C:
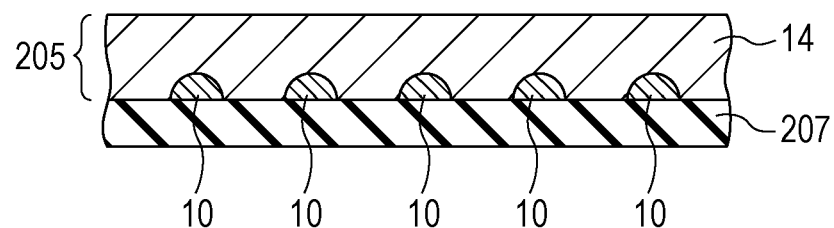

The photoelectric conversion layer includes quantum dots. In FIGS. 21A to 21C, quantum dots 10 are illustrated by way of example. The quantum dots are particles having a particle size in a range of, for example, 1 nm to 20 nm. In some embodiments, the photoelectric conversion layer includes a member formed of a material different from that of the quantum dots. The quantum dots are dispersed in the member. In some other embodiments, the photoelectric conversion layer includes a cover layer that covers the quantum dots. In some other embodiments, the photoelectric conversion layer includes a buried layer in which the quantum dots are buried. In FIGS. 21A to 21C, a member 11, a cover layer 12, and a buried layer 14, which are formed of a material different from that of the quantum dots, are illustrated by way of example. These are collectively referred to as "quantum-dot-disposed members".

This configuration enables electric charge generated by photoelectric conversion to be accumulated in the photoelectric conversion layer. When a signal is read out, the accumulated electric charge can be discharged to the first electrode through a plurality of quantum dots.

The configuration in which the photoelectric conversion layer includes quantum dots may reduce the defect energy levels of the photoelectric conversion layer for the following reasons. Because the size of the quantum dots is small, the lattice defects in the quantum dots can be reduced. Consequently, noise reduction may be achieved.

In some embodiments, the material of the quantum dots is a compound including at least one of the Group IV elements such as tin (Sn), lead (Pb), and copper (Cu), and at least one of the Group VI elements such as oxygen (O), sulfur (S), selenium (Se), and tellurium (Te). For example, the material of the quantum dots may be PbS, PbSe, PbTe, or CuO. In this specification, the compounds described above are referred to as "Group IV-VI compounds".

In some embodiments, the material of the quantum dots is a compound including at least one of the Group III elements such as boron (B), aluminum (Al), gallium (Ga), indium (In), and thallium (Tl), and at least one of the Group V elements such as nitrogen (N), phosphorus (P), arsenic (As), and antimony (Sb). For example, the material of the quantum dots may be BN, GaAs, GaP, AlSb, InSb, InAs, or InGaAs. In this specification, the compounds described above are referred to as "Group III-V compounds".

In some embodiments, the material of the quantum dots is a compound including at least one of the Group II elements such as zinc (Zn), cadmium (Cd), and mercury (Hg), and at least one of the Group VI elements such as oxygen (O), sulfur (S), selenium (Se), and tellurium (Te). For example, the material of the quantum dots may be CdSe, CdTe, ZnS, or HgTe. The compounds described above are referred to as "Group II-VI compounds".

In some embodiments, a Group IV element such as carbon (C), silicon (Si), or germanium (Ge) is used for the material of the quantum dots.

The material of the quantum dots is preferably PbS, PbSe, PbTe, CdS, CdSe, CdTe, C, Si, Ge, or the like. This configuration may achieve further noise reduction.

The material of the quantum-dot-disposed member is a semiconductor material, an insulator material, or a conductive material. Specifically, the material of the quantum-dot-disposed member may be selected from compounds containing PbSO4, PbO, PbSeO4, SiO, SiN, SiON, In2O3, sulfur (S), and sulfur (S), carbon (C), compounds containing carbon (C), and the like. This configuration may improve sensitivity. The material of the quantum-dot-disposed member may also be selected from AlAs, AlGaAs, AlGaAs, GaAs, GaSb, AlSb, and the like. Alternatively, intrinsic silicon (Si) or low-concentration impurity-doped silicon (Si) may be used for a member in which quantum dots are dispersed. Alternatively, an organic resin in which quantum dots are dispersed may be used.

The band gap of the quantum-dot-disposed member is different from the band gap of the quantum dots. For example, the band gap of the quantum-dot-disposed member is larger than the band gap of the quantum dots. This configuration enables the formation of the potential for confinement of carriers generated by photoelectric conversion in the quantum dots.

The quantum dots may have a larger band gap than a band gap in a bulk structure made of the same material. Thus, preferably, a material having a band gap equivalent to or smaller than the band gap of silicon (Si) is used for the quantum dots. Specifically, the band gap is preferably less than or equal to 1.12 electron volts (eV). For example, PbS, PbSe, PbTe, C, Si, Ge, or the like is preferably used. This configuration may improve sensitivity to light having a long wavelength, such as red light.

As used herein, the term "the band gap of a material" refers to a band gap in a bulk structure formed of the material alone. An example of a method for measuring the band gap of a material used for the quantum dots will be described. First, a material used for the quantum dots is identified. Then, a sample is produced by the same material as the identified material, and the wavelength of light that the sample can absorb is measured. The longest wavelength L of the wavelengths of the absorbed light is converted to energy E according to $E=h/L$, where h denotes Planck's constant. The obtained energy E corresponds to the band gap.

A shell may be formed around the quantum dots. This may lead to improved quantum efficiency. Since the size of the quantum dots is small, half or more of the atoms in the quantum dots may be arranged on the surface of the quantum dots. The dangling bonds of the atoms arranged on the surface may result in the formation of defect energy levels. Accordingly, multiple defect energy levels may exist on the surface of the quantum dots. The existence of multiple defect energy levels may cause recombination of electrons and holes to be more likely to occur, resulting in a possible reduction in quantum efficiency. Forming a shell around the quantum dots may reduce the dangling bonds on the surface of the quantum dots. Consequently, quantum efficiency may be improved.

For example, the surface of the quantum dots of hydrophobic CdSe may be coated with ZnS to form a core-shell structure with a CdSe core and a ZnS shell. Alternatively, the surface of the quantum dots of hydrophilic CdTe may be coated with a thiol compound. The methods described above allow electrons in excitons produced by absorption of light to be confined in or near the core and to be less likely to be affected by the surface.

Preferably, the lattice constant of the core is close to the lattice constant of the shell. Specifically, it is desirable that the ratio of the two lattice constants be in a range of 0.9 to 1.1. This configuration may reduce lattice defects, resulting in noise reduction.

The quantum dots may include surface atoms which may be in the coordination site. Such quantum dots have high reactivity, and are more likely to induce aggregation. In order to stabilize the surface of the quantum dots, the surface of the quantum dots may be capped with a capping member. This configuration may prevent the quantum dots from aggregating. Consequently, sensitivity may be improved.

The capping member is formed of a base covalently bound to metal atoms in the quantum dots, an organic polymer, or the like. For example, organic molecules having a straight-chain or branched aliphatic hydrocarbon group with a carbon number of 2 to 30, preferably with a carbon number of 4 to 20, more preferably with a carbon number of 6 to 18, are used. The capping member may have a functional group such as a carboxyl group, an amino group, an amide group, a nitrile group, a hydroxyl group, an ether group, a carbonyl group, a sulfonyl group, a phosphonyl group, or a mercapto group. Such functional groups facilitate control of the coordination of the capping member. The capping member may have a functional group different from a functional group for coordination.

In addition, quantum dots having a particle size in a range of 1 nm to 20 nm enable electrons to be subject to quantum confinement inside the quantum dots. This quantum confinement effect allows the quantum dots to have a band gap which depends on the particle size. With this configuration, the wavelength of the light to be detected can be selected in accordance with the size of the quantum dots.

In the following, exemplary embodiments of the present invention will be described in detail with reference to the drawings. The present invention is not limited to the following exemplary embodiments. A modification in which the configuration of the following exemplary embodiments is partially modified without departing from the scope of the present invention also constitutes an exemplary embodiment of the present invention. Further, an example in which part of the configuration of any of the following exemplary embodiments is added to another exemplary embodiment, or an example in which part of the configuration of any of the following exemplary embodiments is replaced with part of the configuration of another exemplary embodiment also constitutes an exemplary embodiment of the present invention.

First Exemplary Embodiment

FIG. 1A schematically illustrates a configuration of a pixel 100 of a photoelectric conversion device according to this exemplary embodiment. The pixel 100 includes a photoelectric conversion unit 101, a reset transistor 102, a first capacitor 103, an amplifier transistor 104, and a selection transistor 105. While only one pixel 100 is illustrated in FIG. 1A, the photoelectric conversion device according to this exemplary embodiment includes a plurality of pixels 100. In FIG. 1A, furthermore, the cross-sectional structure of the photoelectric conversion unit 101 is schematically illustrated.

The photoelectric conversion unit 101 includes a first electrode 201, a blocking layer 203, a photoelectric conversion layer 205, an insulating layer 207, and a second electrode 209. The first electrode 201 is included in a node A illustrated in FIG. 1A. The second electrode 209 is included in a node B illustrated in FIG. 1A. The first electrode 201 is connected to a voltage supply unit 110. The voltage supply unit 110 supplies a plurality of voltages Vs to the first electrode 201 of the photoelectric conversion unit 101. This configuration enables accumulation of signal charge in the photoelectric conversion unit 101 and discharge of the signal charge from the photoelectric conversion unit 101. The discharge of the signal charge is carried out to read out a signal generated by the photoelectric conversion unit 101.

The voltage supply unit 110 supplies at least a first voltage Vs1 and a second voltage Vs2 different from the first voltage Vs1 to the first electrode 201 of the photoelectric conversion unit 101. If signal charges are holes, the second voltage Vs2 is a voltage lower than the first voltage Vs1. If signal charges are holes, for example, the first voltage Vs1 is equal to 5 V, and the second voltage Vs2 is equal to 0 V. If signal charges are electrons, the second voltage Vs2 is a voltage higher than the first voltage Vs1. If signal charges are electrons, for example, the first voltage Vs1 is equal to 0 V, and the second voltage Vs2 is equal to 5 V. In this specification, the voltage on a grounded node is a reference voltage or 0 V unless otherwise stated.

The node B illustrated in FIG. 1A includes a gate of the amplifier transistor 104. The amplifier transistor 104 is an amplification unit, and the gate of the amplifier transistor 104 is an input node of the amplification unit. That is, the second electrode 209 of the photoelectric conversion unit 101 is electrically connected to the amplification unit. This configuration enables the amplification unit to amplify and output a signal generated by the photoelectric conversion unit 101.

The second electrode 209 is electrically connected to a first terminal of the first capacitor 103. In this exemplary embodiment, the first terminal of the first capacitor 103 is included in the node B. That is, the second electrode 209 and the first terminal of the first capacitor 103 are short-circuited. A second terminal of the first capacitor 103 is included in a node C. The second terminal is capacitively coupled to the first terminal. In other words, the node C is capacitively coupled to the node B via the first capacitor 103. A predetermined voltage is supplied to the second terminal (the node C) of the first capacitor 103. In this exemplary embodiment, the second terminal (the node C) of the first capacitor 103 is grounded. That is, a voltage of 0 V is supplied to the second terminal of the first capacitor 103.

A drain of the reset transistor 102 is connected to a node to which a reset voltage Vres is supplied. A source of the reset transistor 102 is connected to the second electrode 209 of the photoelectric conversion unit 101 and the gate of the amplifier transistor 104. This configuration enables the reset transistor 102 to reset the voltage on the node B to the reset voltage Vres. That is, the reset transistor 102 is a reset unit that supplies the reset voltage Vres to the second electrode 209. Turning off the reset transistor 102 brings the node B configured to include the second electrode 209 of the photoelectric conversion unit 101 into an electrically floating state.

In this exemplary embodiment, a magnitude relationship between the voltage Vs supplied to the first electrode 201 of the photoelectric conversion unit 101 and the reset voltage Vres is controlled to accumulate signal charge in the photoelectric conversion unit 101 and to discharge the signal charge from the photoelectric conversion unit 101. The reset voltage Vres is an intermediate value between the first voltage Vs1 and the second voltage Vs2. For example, if signal charges are holes, the reset voltage Vres is a voltage lower than the first voltage Vs1 and higher than the second voltage Vs2. If signal charges are electrons, the reset voltage Vres is a voltage higher than the first voltage Vs1 and lower than the second voltage Vs2. In this exemplary embodiment, the reset voltage Vres is equal to 3.3 V. The reset voltage Vres is lower than a power supply voltage, and is higher than a voltage to be supplied to the grounded node.

A drain of the amplifier transistor 104 is connected to a node to which the power supply voltage is supplied. A source of the amplifier transistor 104 is connected to an output line 130 via the selection transistor 105. A current source 160 is connected to the output line 130. The amplifier transistor 104 and the current source 160 form a source follower circuit, and a signal generated by the photoelectric conversion unit 101 is output to the output line 130. A column circuit 140 is also connected to the output line 130. A signal from the pixel 100, which is output to the output line 130, is input to the column circuit 140.

Figure 1B:
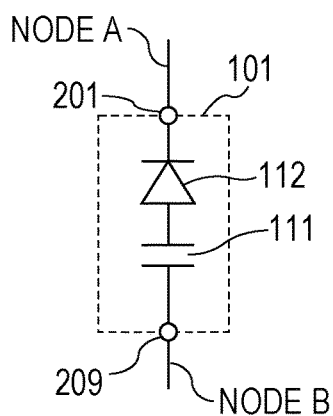
FIGS. 1B and 1C are diagrams illustrating equivalent circuits of a photoelectric conversion unit of the photoelectric conversion device.
Figure 1C:
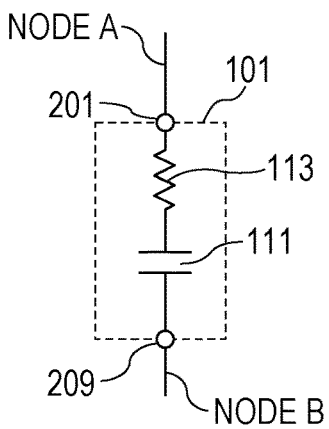

FIGS. 1B and 1C illustrate example equivalent circuit diagrams of the photoelectric conversion unit 101. In this exemplary embodiment, the photoelectric conversion unit 101 includes a photoelectric conversion layer configured to accumulate signal charge, and an insulating layer. Accordingly, the photoelectric conversion unit 101 includes a capacitance component between the first electrode 201 and the second electrode 209. In the equivalent circuits illustrated in FIGS. 1B and 1C, the capacitance component is represented as a second capacitor 111 disposed between the first electrode 201 and the second electrode 209 of the photoelectric conversion unit 101. FIG. 1B illustrates an exemplary embodiment in which the photoelectric conversion unit 101 includes a blocking layer. Thus, the blocking layer and the photoelectric conversion layer are illustrated using the circuit symbol of a diode 112. FIG. 1C illustrates an exemplary embodiment in which a photoelectric conversion layer does not include a blocking layer. Thus, the photoelectric conversion layer is illustrated using the circuit symbol of a resistor 113. The structure of the photoelectric conversion unit 101 is described below.

Figure 2:
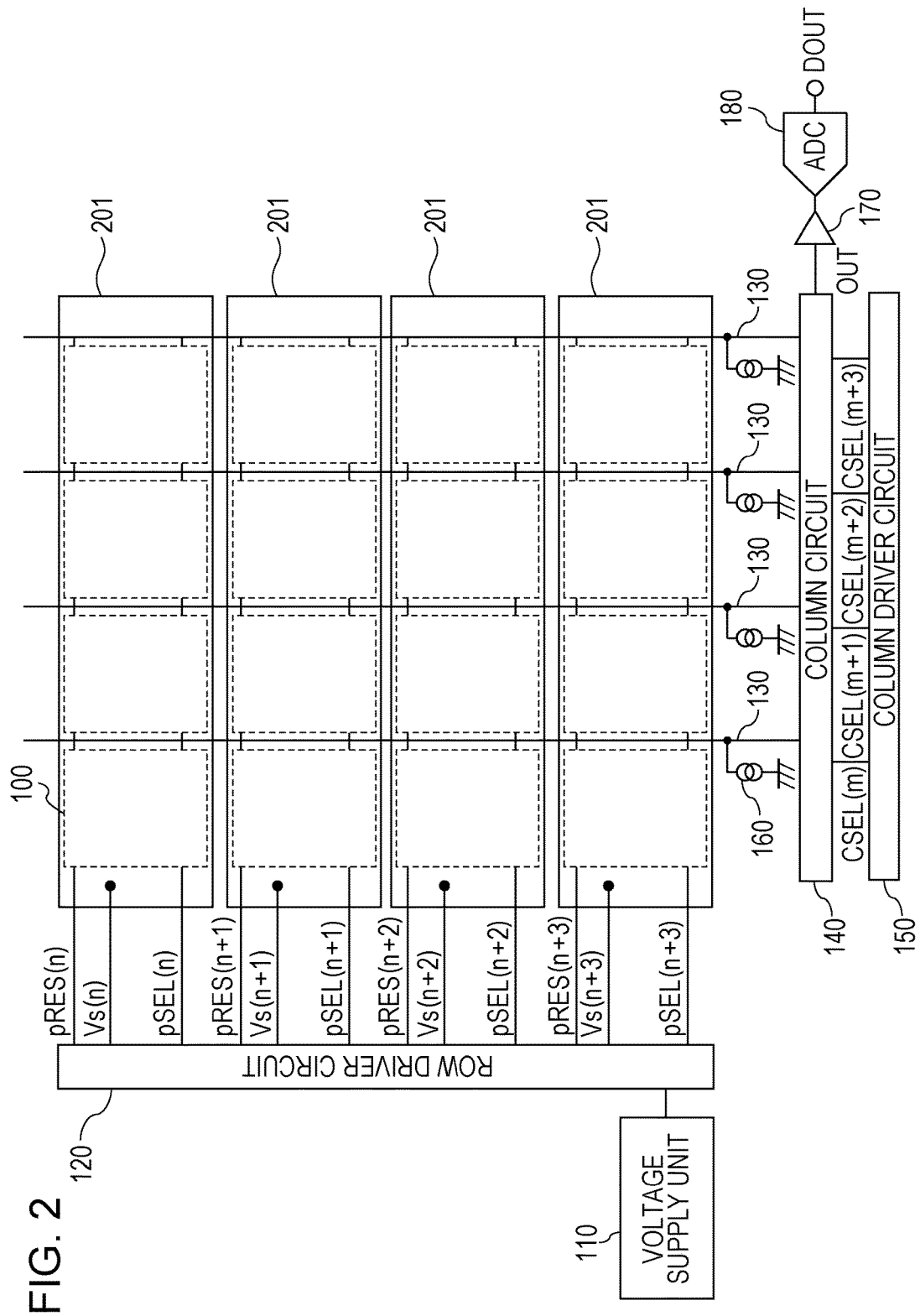
FIG. 2 is a schematic diagram of the overall configuration of the photoelectric conversion device.

FIG. 2 is a schematic diagram of an overall circuit configuration of the photoelectric conversion device according to this exemplary embodiment. Portions having substantially the same functions as those in FIG. 1A are assigned the same numerals.

FIG. 2 illustrates 16 pixels 100 arranged in a matrix of four rows and four columns. A plurality of pixels 100 included in each column are connected to one output line 130. A row driver circuit 120 supplies a drive signal pRES and a drive signal pSEL to the pixels 100. The drive signal pRES is supplied to the gates of the reset transistors 102. The drive signal pSEL is supplied to the gates of the selection transistors 105. The reset transistors 102 and the selection transistors 105 are controlled by the drive signals described above. A plurality of pixels 100 included in each row are connected to a common drive signal line. The drive signal line is a wiring line that transmits the drive signal pRES, the drive signal pSEL, and the like. In FIG. 2, signs indicating rows, such as (n) and (n+1), are assigned to distinguish drive signals to be supplied to different rows. The same applies to the other drawings.

FIG. 2 schematically illustrates the planar structure of the first electrodes 201 of the photoelectric conversion units 101. As illustrated in FIG. 2, photoelectric conversion units 101 of a plurality of pixels 100 included in each row are configured to include a common first electrode 201. As described above, the voltage supply unit 110 supplies a voltage Vs to the first electrodes 201. In this exemplary embodiment, a first electrode 201 is disposed for each row. Thus, the row driver circuit 120 selects a row to which the voltage Vs is supplied from the voltage supply unit 110. Signs indicating rows, such as (n) and (n+1), are assigned to distinguish voltages Vs to be supplied to different rows.

In this exemplary embodiment, the configuration described above enables a plurality of pixels 100 to be driven row-by-row.

The output lines 130 are respectively connected to the column circuits 140. A column driver circuit 150 drives the column circuits 140 on a column-by-column basis. Specifically, the column driver circuit 150 supplies a drive signal CSEL to a plurality of column circuits 140. Signs indicating columns, such as (m) and (m+1), are assigned to distinguish drive signals to be supplied to different columns. The same applies to the other drawings. This configuration enables signals read out in parallel for the respective rows to be sequentially output to an output unit 170.

Figure 3:
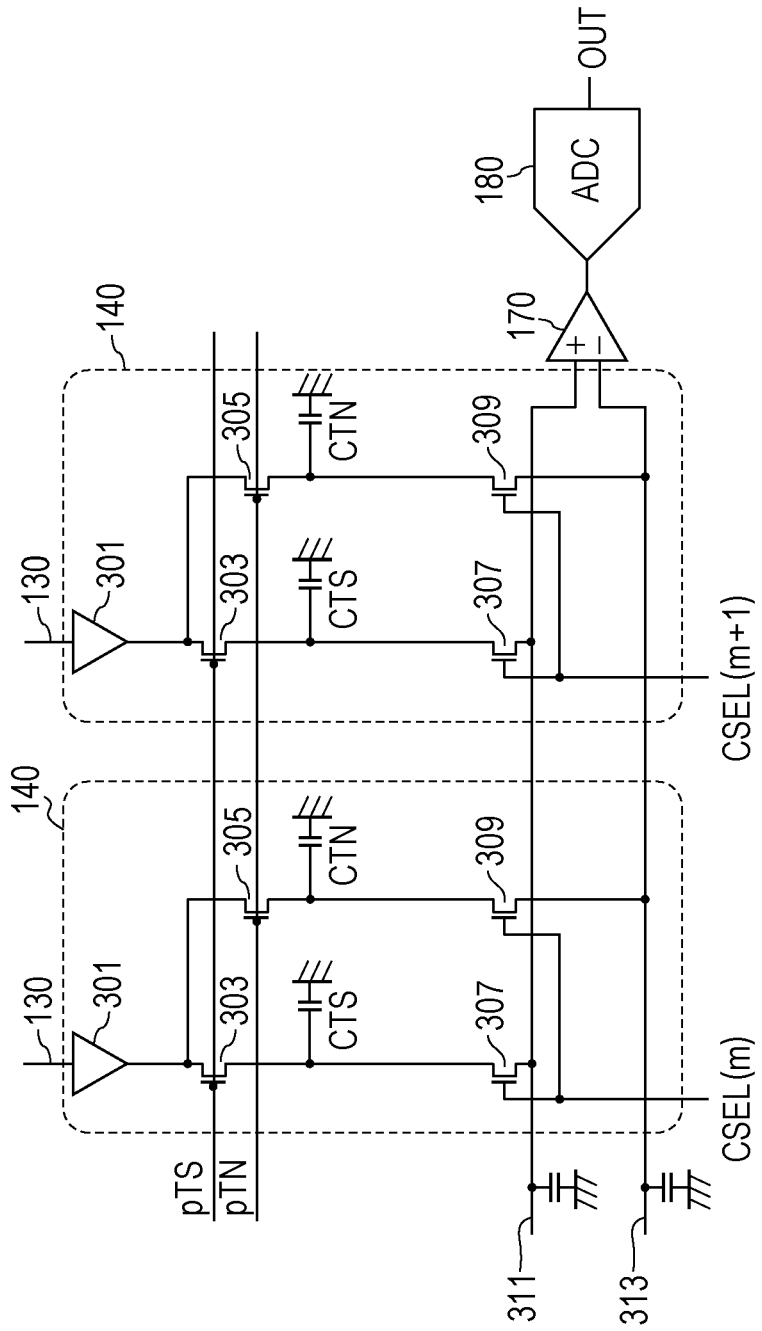
FIG. 3 is a diagram illustrating an equivalent circuit of a column circuit of the photoelectric conversion device.

The column circuits 140 will now be described in detail. FIG. 3 illustrates an equivalent circuit of the column circuits 140 in the m-th column and the (m+1)-th column. The column circuits 140 in the remaining columns are not illustrated.

A signal on each of the output lines 130 is amplified by a column amplifier 301. An output node of the column amplifier 301 is connected to a capacitor CTS via an S/H switch 303. The output node of the column amplifier 301 is also connected to a capacitor CTN via an S/H switch 305. The S/H switch 303 and the S/H switch 305 are controlled by a drive signal pTS and a drive signal pTN, respectively. This configuration enables a noise signal, including reset noise, and an optical signal from each of the pixels 100 to be held. Accordingly, the photoelectric conversion device according to this exemplary embodiment enables correlated double sampling.

The capacitors CTS are connected to a horizontal output line 311 via horizontal transfer switches 307. The capacitors CTN are connected to a horizontal output line 313 via horizontal transfer switches 309. The horizontal transfer switches 307 and 309 are controlled by the drive signal CSEL from the column driver circuit 150.

Both the horizontal output line 311 and the horizontal output line 313 are connected to the output unit 170. The output unit 170 outputs a difference between a signal on the horizontal output line 311 and a signal on the horizontal output line 313 to an analog-to-digital conversion unit 180. The analog-to-digital conversion unit 180 converts an input analog signal into a digital signal.

Each of the column circuits 140 may be an analog-to-digital conversion circuit. In this case, the analog-to-digital conversion circuit includes a holding unit that holds a digital signal, such as a memory or a counter. The holding unit holds digital signals into which a noise signal and an optical signal are converted.

Figure 4:
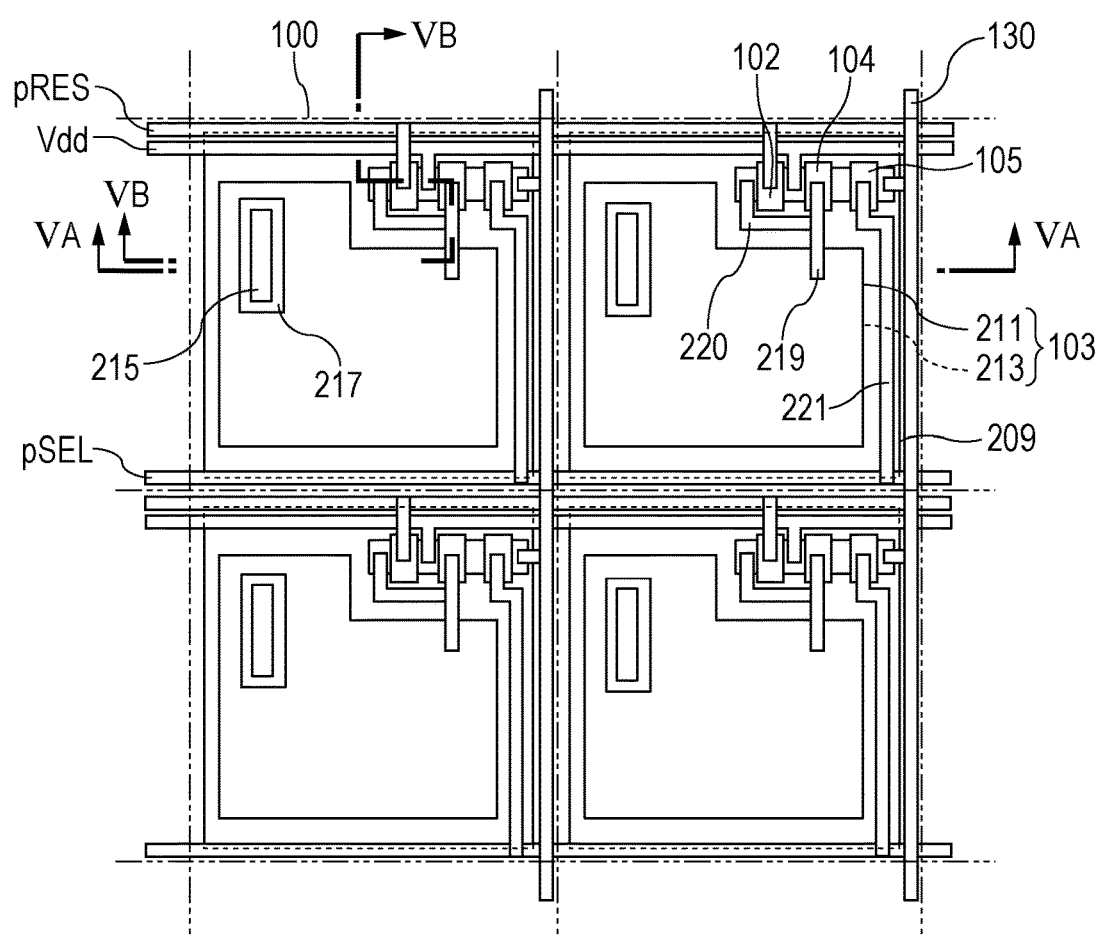
FIG. 4 is a schematic diagram of the planar structure of the photoelectric conversion device.

Next, the planar structure and cross-sectional structure of the photoelectric conversion device according to this exemplary embodiment will be described. FIG. 4 schematically illustrates the planar structure of the photoelectric conversion device. FIGS. 5A and 5B schematically illustrate the cross-sectional structure of the photoelectric conversion device. FIG. 4 illustrates four pixels 100 arranged in a matrix of two rows and two columns. The cross section illustrated in FIG. 5A corresponds to the cross section taken along the line VA-VA in FIG. 4. The cross section illustrated in FIG. 5B corresponds to the cross section taken along the line VB-VB in FIG. 4. Portions having substantially the same functions as those in FIG. 1A are assigned the same numerals. Note that, to indicate a transistor, a numeral is assigned to a gate electrode thereof. Further, a conductive member forming a drive signal line is assigned the same numeral as a drive signal supplied to the drive signal line. For example, a conductive member assigned the numeral pRES forms a drive signal line for supplying the drive signal pRES.

The photoelectric conversion device includes a semiconductor substrate 200. Various semiconductor regions, such as source regions and drain regions of pixel transistors, are disposed on the semiconductor substrate 200. Examples of the pixel transistors include the reset transistor 102, the amplifier transistor 104, and the selection transistor 105. Gate electrodes of the pixel transistors, and a plurality of wiring layers 202 including conductive members that form wiring lines are disposed on the semiconductor substrate 200. The photoelectric conversion units 101 are disposed on top of the wiring layers 202.

As illustrated in FIG. 5A and FIG. 5B, the photoelectric conversion unit 101 of each of the pixels 100 includes the first electrode 201 (common electrode), the blocking layer 203, the photoelectric conversion layer 205, the insulating layer 207, and the second electrode 209 (pixel electrode). The photoelectric conversion layer 205 is disposed between the first electrode 201 and the second electrode 209. The blocking layer 203 is disposed between the first electrode 201 and the photoelectric conversion layer 205. The blocking layer 203 is provided to prevent electric charge of the same conductivity type as the signal charge accumulated in the photoelectric conversion layer 205 from being injected into the photoelectric conversion layer 205 from the first electrode 201. The insulating layer 207 is disposed between the photoelectric conversion layer 205 and the second electrode 209.

As illustrated in FIG. 2, the first electrodes 201 are electrically isolated row-by-row. On the other hand, as illustrated in FIG. 5A, first electrodes 201 of a plurality of pixels 100 included in each row are composed of a common conductive member. For this reason, the first electrodes 201 are also referred to as common electrodes. The planar structure of the first electrodes 201 are illustrated in FIG. 2, and the first electrodes 201 are not illustrated in FIG. 4.

As illustrated in FIG. 4 and FIG. 5A, the second electrode 209 of each of the pixels 100 is electrically isolated from the second electrodes 209 of the other the pixels 100. For this reason, the second electrodes 209 are also referred to as individual electrodes. The blocking layer 203, the photoelectric conversion layer 205, and the insulating layer 207 are disposed continuously across the plurality of pixels 100. Thus, the blocking layer 203, the photoelectric conversion layer 205, and the insulating layer 207 are not illustrated in FIG. 4.

As illustrated in FIG. 4, FIG. 5A, and FIG. 5B, each of the first capacitors 103 includes an upper electrode 211 and a lower electrode 213. The upper electrode 211 and the lower electrode 213 face each other with an insulator interposed therebetween. This configuration provides high design flexibility in the capacitance value of the first capacitor 103 for the following reasons. A semiconductor process such as lithography facilitates determination of the planar shapes of the upper electrode 211 and the lower electrode 213. The first capacitor 103 may have any other structure. In another example, the first capacitor 103 may be a PN junction capacitor having a larger capacitance value than a predetermined value.

Further, the upper electrode 211 and the lower electrode 213 of the first capacitor 103 are disposed in a wiring layer lower than the second electrode 209 of the photoelectric conversion unit 101. The upper electrode 211 and the lower electrode 213 at least partially overlap the first electrode 201 or the second electrode 209 in plan view. This configuration can reduce the size of the pixel 100. Furthermore, each of the upper electrode 211 and the lower electrode 213 includes a portion that does not overlap the reset transistor 102 or the amplifier transistor 104.

In this exemplary embodiment, each of the first capacitors 103 is, for example, a metal/insulator/metal (MIM) capacitor. Specifically, the upper electrode 211 and the lower electrode 213 are each composed of a conductive member such as metal. Alternatively, each of the first capacitors 103 may be a poly-Si/insulator/poly-Si (PIP) capacitor. Specifically, the upper electrode 211 and the lower electrode 213 are each composed of polysilicon. Alternatively, each of the first capacitors 103 may be a metal oxide semiconductor (MOS) capacitor. Specifically, the upper electrode 211 is composed of a conductive member such as metal or polysilicon, and the lower electrode 213 is composed of a semiconductor region.

As illustrated in FIG. 5A and FIG. 5B, the second electrode 209 of each of the photoelectric conversion units 101 is connected to the gate of the amplifier transistor 104 via a conductive member 219. The second electrode 209 of the photoelectric conversion unit 101 is also connected to the source region of the reset transistor 102 via the conductive member 219 and a conductive member 220. Further, the second electrode 209 is connected to the upper electrode 211 of the first capacitor 103 via the conductive member 219. The lower electrode 213 of the first capacitor 103 is connected to a semiconductor region 217 via a contact plug 215. The semiconductor region 217 is grounded.

FIG. 5B illustrates the reset transistor 102 and the gate electrode of the amplifier transistor 104. A gate insulating film 230 is disposed between the gate electrode and the semiconductor substrate 200. The source regions and the drain regions of the pixel transistors are disposed on the semiconductor substrate 200. Since the semiconductor region 217 is grounded, the semiconductor region 217 may be electrically connected to a well 240 in which the source regions and drain regions of the transistors described above are formed.

The configuration of the photoelectric conversion unit 101 will be described in detail. The first electrode 201 of the photoelectric conversion unit 101 is formed of a conductive member with a high optical transmittance. For example, a compound containing indium and/or tin, such as indium tin oxide (ITO), or a compound such as ZnO is used as a material of the first electrode 201. This configuration enables a large amount of light to enter the photoelectric conversion layer 205. Thus, sensitivity may be improved. In another example, polysilicon or metal with a thickness enough to allow a certain amount of light to pass therethrough may be used for the first electrode 201. Metal has low resistance. Therefore, an exemplary embodiment in which metal is used as a material of the first electrode 201 may be advantageous to reduce power consumption or increase the driving speed.

The blocking layer 203 prevents electric charge of the same conductivity type as that of the signal charge from being injected into the photoelectric conversion layer 205 from the first electrode 201. The photoelectric conversion layer 205 is depleted by the voltage Vs applied to the first electrode 201. Further, the gradient of the potential of the photoelectric conversion layer 205 is inverted in accordance with the relationship between the voltage Vs applied to the first electrode 201 and the voltage on the second electrode 209 (the node B). This configuration enables the accumulation of signal charge and the discharge of the accumulated signal charge. The operation of the photoelectric conversion unit 101 will be described below.

FIGS. 21A to 21C are schematic diagrams of the structure of the photoelectric conversion layer 205 according to this exemplary embodiment. In this exemplary embodiment, the photoelectric conversion layer 205 includes quantum dots 10. The quantum dots 10 are made of PbS. The quantum dots 10 have the sufficiently compensated defect energy levels on the surface thereof. Thus, the defect energy levels in the quantum dots 10 and on the surface of the quantum dots 10 are reduced. The quantum dots 10 may be made of any of the various materials described above other than PbS.

In the example illustrated in FIG. 21A, the plurality of quantum dots 10 are dispersed in a member 11 made of a material different from that of the quantum dots 10. In the example illustrated in FIG. 21B, the photoelectric conversion layer 205 includes a cover layer 12 that covers the plurality of quantum dots 10, and an intermediate layer 13 disposed between the cover layer 12 and the blocking layer 203 (not illustrated). In the example illustrated in FIG. 21C, the photoelectric conversion layer 205 includes a buried layer 14 in which the quantum dots 10 are buried. The member 11, the cover layer 12, and the buried layer 14 are formed of Si, SiO, SiN, AlAs, AlGaAs, AlGaAs, GaAs, GaSb, AlSb, or the like.

In this exemplary embodiment, ZnO is used for the blocking layer 203. Instead of this, an n-type or p-type semiconductor of the same kind as that of the semiconductor used for the photoelectric conversion layer 205 and having a higher impurity concentration than that of the semiconductor used for the photoelectric conversion layer 205 may be used for the blocking layer 203. The positions of Fermi level differ because of the different impurity concentrations. Thus, a potential barrier can be formed only for either electrons or holes. The blocking layer 203 is of a conductivity type in which the majority carriers are electric charge carriers of a conductivity type opposite to that of the carriers of the signal charge.

Alternatively, the blocking layer 203 may be formed of a material different from that of the photoelectric conversion layer 205. This configuration enables the formation of a heterojunction. The band gaps differ because of the difference in material. Thus, a potential barrier can be formed only for either electrons or holes.

The insulating layer 207 is disposed between the photoelectric conversion layer 205 and the second electrode 209. The insulating layer 207 is formed of an insulating material. For example, an inorganic material such as silicon oxide, amorphous silicon oxide (hereinafter referred to as "a-SiO"), silicon nitride, or amorphous silicon nitride (a-SiN), or an organic material is used as a material of the insulating layer 207. The insulating layer 207 has desirably a thickness enough to prevent tunneling of electric charge. This configuration can reduce leakage current, and can therefore reduce noise. Specifically, it is desirable that the insulating layer 207 have a thickness greater than or equal to 50 nm.

In a case where a-Si, a-SiO, or a-SiN is used for the blocking layer 203, the photoelectric conversion layer 205, and the insulating layer 207, hydrogenation may be performed and dangling bonds may be terminated by hydrogen. This configuration may reduce noise.

The second electrode 209 is composed of a conductive member such as metal. The second electrode 209 is made of the same material as a conductive member forming a wiring line or a conductive member forming a pad electrode for external connection. This configuration enables simultaneous formation of the second electrode 209 and a wiring line or a pad electrode. Accordingly, the manufacturing process may be simplified.

Next, the operation of the photoelectric conversion unit 101 according to this exemplary embodiment will be described. FIGS. 6A to 6F schematically illustrate energy bands in the photoelectric conversion unit 101. In FIGS. 6A to 6F, the energy bands of the first electrode 201, the blocking layer 203, the photoelectric conversion layer 205, the insulating layer 207, and the second electrode 209 are illustrated. The vertical axis in FIGS. 6A to 6F represents the potential of electrons. The potential of electrons increases along the vertical axis in an upward direction in FIGS. 6A to 6F. Accordingly, the voltage decreases along the vertical axis in an upward direction in FIGS. 6A to 6F. For the first electrode 201 and the second electrode 209, the energy level of free electrons is illustrated. For the blocking layer 203 and the photoelectric conversion layer 205, a band gap between the energy level of the conduction band and the energy level of the valence band is illustrated. The potential of the photoelectric conversion layer 205 at the interface between the photoelectric conversion layer 205 and the insulating layer 207 is referred to as the "surface potential of the photoelectric conversion layer 205" or simply as the "surface potential", for convenience.

In the operation of the photoelectric conversion unit 101, the following steps (1) to (6) are repeatedly performed: (1) the reset of the input node of the amplification unit, (2) the readout of a noise signal, (3) the discharge of signal charge from the photoelectric conversion unit, (4) the readout of an optical signal, (5) the reset before accumulation of signal charge is started, and (6) the accumulation of signal charge. In the following, the respective steps will be described.

Figure 6A:
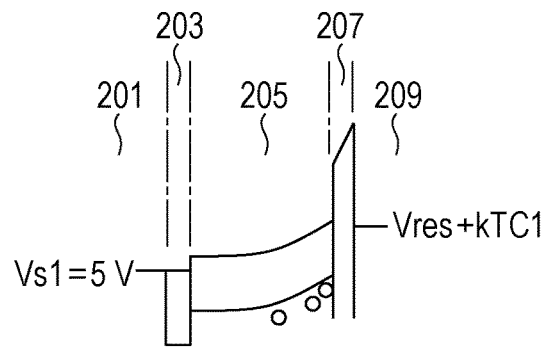
FIGS. 6A to 6F are schematic diagrams of the potential of the photoelectric conversion unit of the photoelectric conversion device.

FIG. 6A illustrates the state of the photoelectric conversion unit 101 in step (1) to step (2). The first voltage Vs1 is supplied to the first electrode 201 from the voltage supply unit 110. The first voltage Vs1 is equal to, for example, 5 V. In the photoelectric conversion layer 205, holes plotted using empty circles are accumulated as signal charges generated during an exposure period. The surface potential of the photoelectric conversion layer 205 changes in the direction in which the surface potential decreases (i.e., in the direction in which voltage increases) in accordance with the number of accumulated holes. In the case of accumulation of electrons, the surface potential changes in the direction in which the surface potential increases (i.e., in the direction in which voltage decreases) in accordance with the number of accumulated electrons.

In this state, the reset transistor 102 is turned on. Accordingly, the voltage on a node including the second electrode 209, that is, the voltage on the node B illustrated in FIG. 1A, is reset to the reset voltage Vres. In this exemplary embodiment, the node B includes the gate of the amplifier transistor 104. Thus, the voltage at the gate of the amplifier transistor 104 is reset. The reset voltage Vres is equal to, for example, 3.3 V.

After that, the reset transistor 102 is turned off. Accordingly, the node B is brought into an electrically floating state. In this case, reset noise (noise kTC1 illustrated in FIG. 6A) may be generated by the reset transistor 102.

The surface potential of the photoelectric conversion layer 205 may change in accordance with a change in the voltage on the second electrode 209 during the reset operation. In this case, the direction in which the voltage on the second electrode 209 changes is opposite to the direction in which the voltage on the second electrode 209 has changed due to the accumulation of signal charge. For this reason, the holes of the signal charge remain accumulated in the photoelectric conversion layer 205. In addition, the blocking layer 203 prevents injection of holes from the first electrode 201. Thus, the amount of signal charge accumulated in the photoelectric conversion layer 205 does not change.

If the selection transistor 105 is in an on state, the amplifier transistor 104 outputs a noise signal (Vres+kTC1) including the reset noise from the pixel 100. The noise signal is held in the capacitor CTN of the column circuit 140.

Figure 6B:
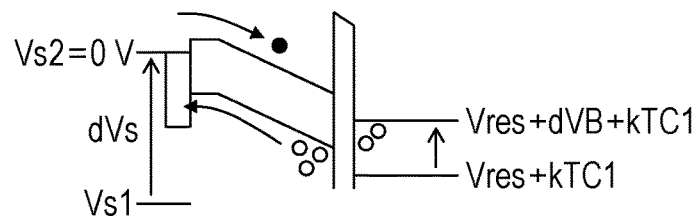
Figure 6C:
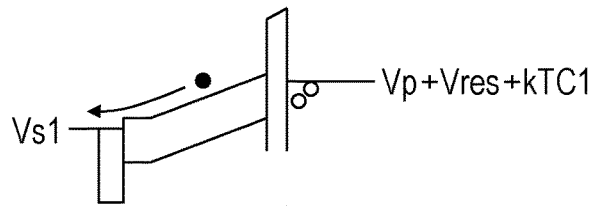

FIGS. 6B and 6C illustrate the state of the photoelectric conversion unit 101 in step (3). First, the second voltage Vs2 is supplied to the first electrode 201. Since holes are used as signal charges, the second voltage Vs2 is a voltage lower than the first voltage Vs1. The second voltage Vs2 is equal to, for example, 0 V.

In this case, the voltage on the second electrode 209 (the node B) changes in the same direction as the direction in which the voltage on the first electrode 201 changes. An amount of change dVB in the voltage on the second electrode 209 is determined in accordance with the ratio of the capacitance value C1 of the first capacitor 103 connected to the second electrode 209 to the capacitance value C2 of the second capacitor 111 included in the photoelectric conversion unit 101. The amount of change dVB in the voltage on the second electrode 209 with respect to an amount of change dVs in the voltage on the first electrode 201 is given by dVB=dVs×C2/(C1+C2). The node B including the second electrode 209 may also include other capacitance components. The other capacitance components have a much smaller capacitance value than the capacitance value C1 of the first capacitor 103. Thus, the capacitance value of the node B can be regarded as being equal to the capacitance value C1 of the first capacitor 103.

In this exemplary embodiment, the amount of change dVs in the voltage on the first electrode 201 is much larger than the amount of change dVB in the voltage on the second electrode 209. Thus, the potential of the second electrode 209 is lower than the potential of the first electrode 201, and the gradient of the potential of the photoelectric conversion layer 205 is inverted. Accordingly, an electron plotted using a solid circle is injected into the photoelectric conversion layer 205 from the first electrode 201. In addition, some or all of the holes accumulated in the photoelectric conversion layer 205 as signal charges move to the blocking layer 203. The holes that have moved are recombined with the majority carriers in the blocking layer 203 and disappear. Consequently, the holes in the photoelectric conversion layer 205 are discharged from the photoelectric conversion layer 205. For the depletion of the entire photoelectric conversion layer 205, all the holes accumulated as signal charges are discharged.

Then, in the state illustrated in FIG. 6C, the first voltage Vs1 is supplied to the first electrode 201. Accordingly, the gradient of the potential of the photoelectric conversion layer 205 is inverted again. Thus, the electrons injected into the photoelectric conversion layer 205 in the state illustrated in FIG. 6B are discharged from the photoelectric conversion layer 205. On the other hand, the blocking layer 203 prevents injection of holes into the photoelectric conversion layer 205 from the first electrode 201. Accordingly, the surface potential of the photoelectric conversion layer 205 changes in accordance with the number of holes that have been accumulated. In accordance with the change in surface potential, the voltage on the second electrode 209 changes from the reset state by a voltage Vp corresponding to the number of holes that have disappeared. That is, the voltage Vp corresponding to the number of holes accumulated as signal charges appears at the node B. The voltage Vp corresponding to the number of accumulated holes is referred to as an "optical signal component".

In the state illustrated in FIG. 6C, the selection transistor 105 is turned on. Accordingly, the amplifier transistor 104 outputs an optical signal (Vp+Vres+kTC1) from the pixel 100. The optical signal is held in the capacitor CTS of the column circuit 140. The difference between the noise signal (Vres+kTC1) read out in step (2) and the optical signal (Vp+Vres+kTC1) read out in step (4) is a signal based on the voltage Vp corresponding to the accumulated signal charge.

Figure 6D:
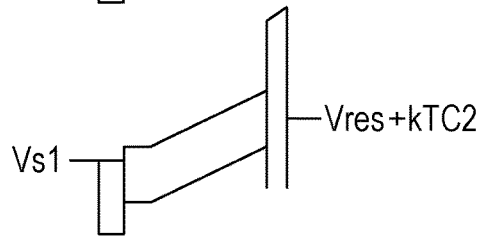

FIG. 6D illustrates the state of the photoelectric conversion unit 101 in step (5). The reset transistor 102 is turned on, and the voltage on the node B is reset to the reset voltage Vres. After that, the reset transistor 102 is turned off. In the way described above, the node B is reset before the accumulation of signal charge is started, enabling the optical signal component for the preceding frame which has been accumulated in the node B to be removed. Accordingly, the dynamic range may be prevented from being narrowed in accordance with the accumulation of optical signals in the node B. Note that the reset before accumulation of signal charge is started in step (5) may not necessarily be performed.

Also in this case, reset noise (noise kTC2 illustrated in FIG. 6D) may be generated by the reset transistor 102. The generated reset noise can be removed through the reset operation in step (1) after the completion of the accumulation period.

Figure 6E:
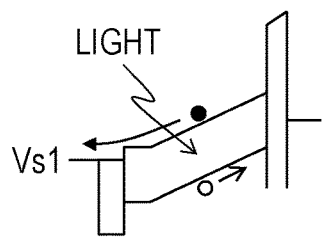
Figure 6F:
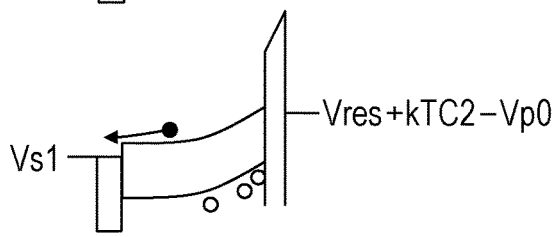

FIGS. 6E and 6F illustrate the state of the photoelectric conversion unit 101 in step (6). The first voltage Vs1 is supplied to the first electrode 201, and the reset voltage Vres is supplied to the node B. Since the reset voltage Vres is lower than the first voltage Vs1, the electrons in the photoelectric conversion layer 205 are discharged to the first electrode 201. In contrast, the holes in the photoelectric conversion layer 205 move to the interface between the photoelectric conversion layer 205 and the insulating layer 207. However, the holes are not movable to the insulating layer 207, and are thus accumulated in the photoelectric conversion layer 205. In addition, as described previously, the blocking layer 203 prevents the holes from being injected into the photoelectric conversion layer 205. In this state, when light enters the photoelectric conversion layer 205, only the holes in the electron-hole pairs generated by photoelectric conversion are accumulated in the photoelectric conversion layer 205 as signal charges. After the accumulation operation has been performed for a certain period, the operations in steps (1) to (6) are repeatedly performed.

The accumulated holes cause a change in the surface potential of the photoelectric conversion layer 205. In accordance with the change in surface potential, the voltage on the second electrode 209 increases. This increase is represented by Vp0 in FIG. 6F. In the reset operation in FIG. 6A, as described above, the voltage on the second electrode 209 changes so as to cancel out the change of the voltage Vp0. That is, the voltage on the second electrode 209 decreases. Accordingly, the surface potential of the photoelectric conversion layer 205 changes in the direction in which the surface potential increases.

If signal charges are electrons, the second voltage Vs2 is a voltage higher than the first voltage Vs1. Thus, the gradient of the potential illustrated in FIGS. 6A to 6F is inverted. The other operations are substantially the same.

In the operation described with reference to FIGS. 6A to 6F, the gradient of the potential of the photoelectric conversion layer 205 is inverted in the state illustrated in FIG. 6B, enabling the discharge of the accumulated signal charge. Non-inversion of the gradient of the potential of the photoelectric conversion layer 205 causes the occurrence of electric charge that is not discharged. Thus, noise may occur. Here, as the amount by which the amount of change dVs in the voltage on the first electrode 201 is larger than the amount of change dVB in the voltage on the second electrode 209 (the node B) increases, the gradient of the potential is more likely to be inverted. That is, as the amount by which the amount of change dVs in the voltage on the first electrode 201 is larger than the amount of change dVB in the voltage on the second electrode 209 increases, further noise reduction is achievable.

As described above, there is a relationship represented by dVB=dVs×C2/(C1+C2) between the amount of change dVs in the voltage on the first electrode 201 and the amount of change dVB in the voltage on the node B. Modifying this equation yields the following equation for the amount of change dVs in the voltage on the first electrode 201: dVs=dVB+(C1/C2)×dVB. That is, the amount of change dVs in the voltage on the first electrode 201 is larger than the amount of change dVB in the voltage on the second electrode 209 by (C1/C2)×dVB. Accordingly, as the capacitance value C1 of the node B increases, the difference between the amount of change dVs in the voltage on the first electrode 201 and the amount of change dVB in the voltage on the second electrode 209 increases.

In this exemplary embodiment, the first capacitor 103 is connected to the second electrode 209. Thus, the capacitance value C1 of the node B can be increased. This configuration enables the amount of change dVs in the voltage on the first electrode 201 to be larger than the amount of change dVB in the voltage on the second electrode 209. Consequently, depletion of the photoelectric conversion layer 205 is more likely to be achieved, resulting in a reduction in electric charge that is not discharged. According to this exemplary embodiment, therefore, noise reduction may be achieved.

A description will be given of a comparative example in which the first capacitor 103 is not connected to the node B. In this configuration, the node B has a capacitance that may include a capacitance component due to a PN junction in a semiconductor region and a parasitic capacitance component of a wiring line. Since the capacitance components described above are negligibly smaller than the capacitance value C2 of the second capacitor 111 included in the photoelectric conversion unit 101, the value given by C1/C2 is substantially equal to zero. Thus, when the second voltage Vs2 is supplied to the first electrode 201, the amount of change dVs in the voltage on the first electrode 201 is substantially equal to the amount of change dVB in the voltage on the second electrode 209. In this case, the gradient of the potential may not be inverted in the state illustrated in FIG. 6B, resulting in a possibility that some of the holes accumulated as signal charges will not be discharged. In this exemplary embodiment, by contrast to the comparative example, the amount of signal charge that is not discharged can be reduced, resulting in noise reduction.

A description will now be given of the relationship among the capacitance value C1 of the first capacitor 103, the capacitance value C2 of the second capacitor 111 included in the photoelectric conversion unit 101, and the voltage supplied to each unit.

In this exemplary embodiment, the photoelectric conversion unit 101 includes the blocking layer 203, the photoelectric conversion layer 205, and the insulating layer 207. The blocking layer 203 has a higher conductivity than the photoelectric conversion layer 205 and the insulating layer 207. Thus, the capacitance value C2 of the second capacitor 111 included in the photoelectric conversion unit 101 is a combined capacitance of a capacitance component Ci formed by the photoelectric conversion layer 205 and a capacitance component Cins formed by the insulating layer 207. Specifically, the capacitance value C2 of the second capacitor 111 is given by Expression (1) as follows:

$$C2 = Ci \times Cins/(Ci+Cins) \qquad (1)$$

The capacitance component Ci and the capacitance component Cins are respectively given by Expression (2) and Expression (3) as follows:

$$Ci = E0 \times Ei \times Ss/di \qquad (2)$$

$$Cins = E0 \times Eins \times Ss/dins, \qquad (3)$$

where Ss denotes the area of the second electrode 209 in plan view, di denotes the thickness of the photoelectric conversion layer 205, dins denotes the thickness of the insulating layer 207, Ei denotes the relative dielectric constant of the photoelectric conversion layer 205, Eins denotes the relative dielectric constant of the insulating layer 207, and E0 denotes the dielectric constant of vacuum.

The fringing field around the second electrode 209 is substantially negligible. Thus, it is sufficient to take into account only the area Ss of the second electrode 209 in plan view as the area used for the calculation of capacitance. The area Ss of the second electrode 209 in plan view is, for example, the area of the second electrode 209 illustrated in FIG. 4. Further, in FIGS. 5A and 5B, the thickness di of the photoelectric conversion layer 205 and the thickness dins of the insulating layer 207 are illustrated.

The capacitance value C1 of the first capacitor 103 is given by Expression (4) as follows:

$$C1 = E0 \times Ed \times Sd/dd, \qquad (4)$$

where Sd denotes the area of the upper electrode 211 or the lower electrode 213 in plan view, dd denotes the distance between the upper electrode 211 and the lower electrode 213, and Ed denotes the dielectric constant of an insulating layer between the upper electrode 211 and the lower electrode 213.

In this exemplary embodiment, the voltage Vs on the first electrode 201 (the node A) is controlled using the first voltage Vs1 and the second voltage Vs2 to accumulate signal charge and discharge the signal charge due to the depletion of the photoelectric conversion layer 205. The capacitance value C1 of the first capacitor 103 and the capacitance value C2 of the second capacitor 111 satisfy the following relationship, thereby achieving a reduction in the electric charge remaining in the photoelectric conversion layer 205 during the discharge of signal charge described above. An exemplary embodiment in which signal charges are holes will be described first.

In the following, for simplicity, the capacitance value C1 of the first capacitor 103 is k times as large as the capacitance value C2 of the second capacitor 111. That is, the capacitance value C1 and the capacitance value C2 have a relationship of Expression (5) as follows:

$$C1 = k \times C2 \quad (5)$$

As described previously, the amount of change dVs in the voltage on the first electrode 201 and the amount of change dVB in the voltage on the second electrode 209 (the node B) have a relationship given by Expression (6) as follows:

$$dVB = dVs \times C2/(C1+C2). \quad (6)$$

Expression (5) and Expression (6) yield Expression (7) as follows:

$$dVB = dVs/(1+k). \quad (7)$$

To accumulate holes as signal charges, it is desirable that the first voltage Vs1 and the reset voltage Vres satisfy a relationship of Expression (8) as follows:

$$Vs1 > Vres. \quad (8)$$

To transfer the holes of the signal charge, it is desirable that the first voltage Vs1, the reset voltage Vres, the amount of change dVs in the voltage on the first electrode 201, and the amount of change dVB in the voltage on the second electrode 209 satisfy a relationship of Expression (9) as follows:

$$Vs1 + dVs < Vres + dVB. \quad (9)$$

If the relationship of Expression (8) is satisfied, the gradient of the potential that allows holes to drift toward the insulating layer 207 can be formed in the photoelectric conversion layer 205. If the relationship of Expression (9) is satisfied, it is easy to reverse the gradient of the potential of the photoelectric conversion layer 205.

Expression (7) and Expression (9) yield Expression (10).

$$Vs1 - Vres + dVs < dVs/(1+k) \quad (10)$$

Here, k>0. Thus, Expression (10) is modified into Expression (11) below by multiplying both sides of Expression (10) by (1+k).

$$(1+k) \times (Vs1 - Vres + dVs) < dVs \quad (11)$$

The amount of change dVs in the voltage on the first electrode 201 is given by dVs=Vs2−Vs1. Thus, Vs1−Vres+dVs=Vs2−Vres is obtained. In an exemplary embodiment in which signal charges are holes, the reset voltage Vres is higher than the second voltage Vs2. That is, Vs2−Vres<0 is obtained. Accordingly, the relationship of Expression (12) below is satisfied.

$$Vs1 - Vres + dVs < 0 \quad (12)$$

Accordingly, dividing both sides of Expression (11) by (Vs1−Vres+dVs) changes the orientation of the inequality sign, yielding the relationship of Expression (13) as follows:

$$1+k > dVs/(Vs1 - Vres + dVs). \quad (13)$$

Expression (13) yields a relational expression given by Expression (14) below for a capacity ratio k of the capacitance value C1 and the capacitance value C2.

$$k > \frac{dVs}{Vs1 - Vres + dVs} - 1 \quad (14)$$

If the relationship of Expression (14) is satisfied, the amount of electric charge that is not discharged can be reduced. Accordingly, noise reduction may be achieved.

In this exemplary embodiment, the first voltage Vs1 is equal to 5 V, and the reset voltage Vres is equal to 3.3 V. Since the second voltage Vs2 is equal to 0 V, the amount of change dVs in the voltage on the first electrode 201 is −5 V. Thus, the value k is set to a value larger than 0.52. Specifically, in this exemplary embodiment, the capacitance value C1 of the first capacitor 103 is equal to 4 fF, and the capacitance value C2 of the second capacitor 111 is equal to 1 fF. That is, k=4 is obtained. This configuration may achieve more noise reduction.

In this exemplary embodiment, the area Sd of either the upper electrode 211 or the lower electrode 213 of the first capacitor 103 in plan view and the area Ss of the second electrode 209 in plan view satisfy a relationship of Sd>0.5× Ss. This configuration may make it easy to obtain the relationship of the capacity ratio described above.

Further, as the value k increases, the noise reduction effect increases. Accordingly, in a case where the capacitance value C1 of the first capacitor 103 is equal to or greater than the capacitance value C2 of the second capacitor 111, the noise reduction effect may further be increased.

The amount of change dVs in the voltage on the first electrode 201 is given by dVs=Vs2−Vs1 using the first voltage Vs1 and the second voltage Vs2. Accordingly, Expression (14) is modified into Expression (15).

$$k > \frac{Vs2 - Vs1}{Vs2 - Vres} - 1 \quad (15)$$

In particular, if the second voltage Vs2 is equal to 0 V, Expression (15) can be simplified into Expression (16).

$$k > \frac{Vs1}{Vres} - 1 \quad (16)$$

An exemplary embodiment in which signal charges are electrons will now be described. If signal charges are electrons, the orientations of the inequality signs in Expression (8) and Expression (9) are changed. Accordingly, the orientations of the inequality signs in Expression (10) to Expression (11) are also changed. If signal charges are electrons, the reset voltage Vres is lower than the second voltage Vs2. Thus, the value given by Vs1−Vres+dVs=Vs2−Vres in Expression (11) is a positive value. That is, the relationship of (Vs1−Vres+dVs)>0 holds true. Thus, dividing both sides of Expression (11) by (Vs1−Vres+dVs) does not change the orientation of the inequality sign. Consequently, as in the case where signal charges are holes, Expression (14) and Expression (15) are obtained.

The left-hand side of Expression (15) can be replaced with C1/C2 using Expression (5). Since (Vs2−Vres)/(Vs2−Vres)=1, bringing the right-hand side of Expression (15) to the common denominator yields Expression (17) as follows:

$$\frac{C1}{C2} > \frac{Vres - Vs1}{Vs2 - Vres} \quad (17)$$

Here, the relationship given by Expression (17) will be described. The reset voltage Vres is an intermediate value between the first voltage Vs1 and the second voltage Vs2.

As the reset voltage Vres approaches the first voltage Vs1, the value on the right-hand side decreases. That is, even if the capacitance value C1 of the first capacitor 103 is small, the gradient of the potential of the photoelectric conversion layer 205 can be inverted. If the difference between the reset voltage Vres and the first voltage Vs1 is small, the amount of electric charge that can be accumulated in the photoelectric conversion layer 205 is small.

In contrast, as the reset voltage Vres approaches the second voltage Vs2, the value on the right-hand side increases. That is, a large value is used for the capacitance value C1 of the first capacitor 103. In this case, the difference between the reset voltage Vres and the first voltage Vs1 is large. Thus, the amount of electric charge that can be accumulated in the photoelectric conversion layer 205 can be increased.

In terms of the balance between the saturated amount of electric charge and the capacitance value C1 of the first capacitor 103, it is preferable that the reset voltage Vres be in a range of 20% to 80% of the range with an upper limit and a lower limit (or a lower limit and an upper limit) equal to the first voltage Vs1 and the second voltage Vs2, respectively. For example, if the first voltage Vs1 is equal to 5 V and the second voltage Vs2 is equal to 0 V, it is desirable that the reset voltage Vres be in a range of 1 V to 4 V.

In a case where the photoelectric conversion device is used as an image sensor of a camera or the like, a low power supply voltage is used for a reduction in power consumption. For example, the power supply voltage supplied to an image sensor is typically less than or equal to 5 V. Accordingly, values less than or equal to 5 V are also used for the voltages in Expression (14) to Expression (17). In this case, the capacitance value C1 of the first capacitor 103 and the capacitance value C2 of the second capacitor 111 satisfy the relationship described above, enabling noise reduction with low-voltage driving of the photoelectric conversion device.

As described above, noise reduction may be achieved using the relationship between the capacitance value C1 of the first capacitor 103 and the capacitance value C2 of the second capacitor 111 included in the photoelectric conversion unit 101.

The numerical values given in the foregoing are merely examples, and are not intended to be limiting.

Defect energy levels and the like may be present at the interface between the photoelectric conversion layer 205 and the insulating layer 207. In this case, it may be sufficient to take into account the flatband voltage by using a known technique.

Figure 7:
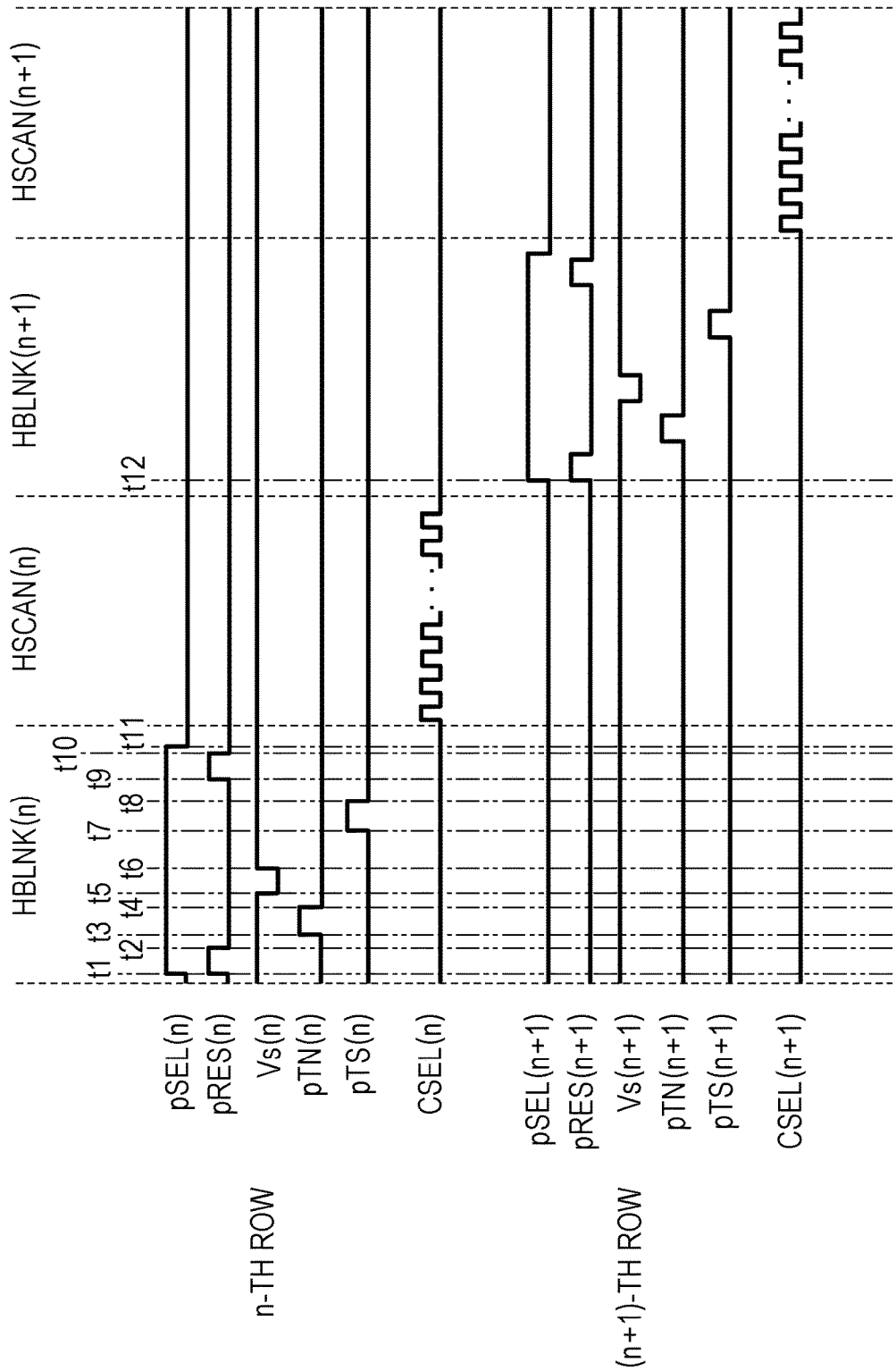
FIG. 7 is a diagram illustrating a timing chart of drive signals used in the photoelectric conversion device.

Next, a method for driving the photoelectric conversion device according to this exemplary embodiment will be described. FIG. 7 illustrates a timing chart of drive signals used in the photoelectric conversion device according to this exemplary embodiment. In FIG. 7, drive signals for signal readout for the n-th row and the (n+1)-th row, or two rows in total, are illustrated.

The drive signal pSEL is supplied to a gate of the selection transistor 105. The drive signal pRES is supplied to a gate of the reset transistor 102. The voltage signal Vs is supplied to the first electrode 201 of the photoelectric conversion unit 101. The drive signal pTS is supplied to the S/H switch 303. The drive signal pTN is supplied to the S/H switch 305. The drive signal CSEL is supplied to the column driver circuit 150.

When the drive signal pSEL, the drive signal pRES, the drive signal pTN, or the drive signal pTS is in high level, the corresponding transistor or switch is turned on. When the drive signal pSEL, the drive signal pRES, the drive signal pTN, or the drive signal pTS is in low level, the corresponding transistor or switch is turned off. The voltage signal Vs includes the first voltage Vs1 and the second voltage Vs2.

The photoelectric conversion device according to this exemplary embodiment performs a "rolling shutter" operation. Before time t1, the photoelectric conversion units 101 of the pixels 100 in the n-th row and the photoelectric conversion units 101 of the pixels 100 in the (n+1)-th row accumulate signal charge. Before time t1, furthermore, the voltage signal Vs(n) for the n-th row and the voltage signal Vs(n+1) for the (n+1)-th row are each equal to the first voltage Vs1.

At time t1, the drive signal pSEL(n) rises to a high level, and the selection transistors 105 of the pixels 100 in the n-th row are turned on. Accordingly, the amplifier transistors 104 of the pixels 100 in the n-th row output a signal.

At time t1, the drive signal pRES(n) rises to a high level, and the reset transistors 102 of the pixels 100 in the n-th row are turned on. Accordingly, the voltage on the nodes B of the pixels 100 in the n-th row is reset to the reset voltage Vres. After that, at time t2, the drive signal pRES(n) falls to a low level, and the reset transistors 102 are turned off. The state of the energy band of each of the photoelectric conversion units 101 at this time is illustrated in FIG. 6A.

Then, the drive signal pTN(n) rises to a high level at time t3, and falls to a low level at time t4. Accordingly, a noise signal including reset noise (kTC1 illustrated in FIG. 6A) is held in the capacitors CTN of the column circuits 140.

At time t5, the voltage signal Vs(n) transitions from the first voltage Vs1 to the second voltage Vs2. The state of the energy band of each of the photoelectric conversion units 101 at this time is illustrated in FIG. 6B. Subsequently, at time t6, the voltage signal Vs(n) transitions from the second voltage Vs2 to the first voltage Vs1. The state of the energy band of each of the photoelectric conversion units 101 at this time is illustrated in FIG. 6C. Through the operation from time t5 to time t6, the signal charge is transferred in the way described above. Accordingly, the voltage Vp corresponding to the amount of accumulated signal charge is generated in the nodes B.

The drive signal pTS(n) rises to a high level at time t7, and falls to a low level at time t8. Accordingly, an optical signal including the voltage Vp and the reset noise (kTC1 illustrated in FIG. 6C) is held in the capacitors CTS of the column circuits 140.

Subsequently, the drive signal pRES(n) rises to a high level at time t9, and falls to a low level at time t10. Accordingly, the voltage on the nodes B of the pixels 100 in the n-th row is again reset to the reset voltage Vres. The state of the energy band of each of the photoelectric conversion units 101 at this time is illustrated in FIG. 6D.

Thereafter, the pixels 100 in the n-th row start accumulation of signal charge for the subsequent frame. The state of the energy band of each of the photoelectric conversion units 101 during the accumulation of signal charge is illustrated in FIGS. 6E and 6F.

At time t11, the drive signal pSEL(n) falls to a low level, and the readout of signals to the column circuits 140 from the pixels 100 in the n-th row is completed.

The noise signals and the optical signals read out to the column circuits 140 are output to the output unit 170 on a column-by-column basis in accordance with the drive signal CSEL. The output unit 170 outputs differences between the optical signals and the noise signals to the analog-to-digital conversion unit 180.

At time t12, the drive signal pSEL(n+1) rises to a high level, and the selection transistors 105 of the pixels 100 in the (n+1)-th row are turned on. In the subsequent operation, signals are read out from the pixels 100 in the (n+1)-th row. This operation is similar to the operation from time t1 to time t11, and is not described herein.

In the photoelectric conversion device according to this exemplary embodiment, as described above, the photoelectric conversion layer 205 includes the quantum dots 10. This configuration enables a reduction in the defect energy levels in the photoelectric conversion layer for the following reasons. Because the size of the quantum dots is small, the lattice defects in the quantum dots can be reduced. Consequently, noise reduction may be achieved.

Second Exemplary Embodiment

Another exemplary embodiment will be described. This exemplary embodiment is different from the first exemplary embodiment in a node to which a voltage supply unit supplies a voltage. Thus, only portions different from the first exemplary embodiment are described. Portions that are substantially the same as those in the first exemplary embodiment are not described.

Figure 8:
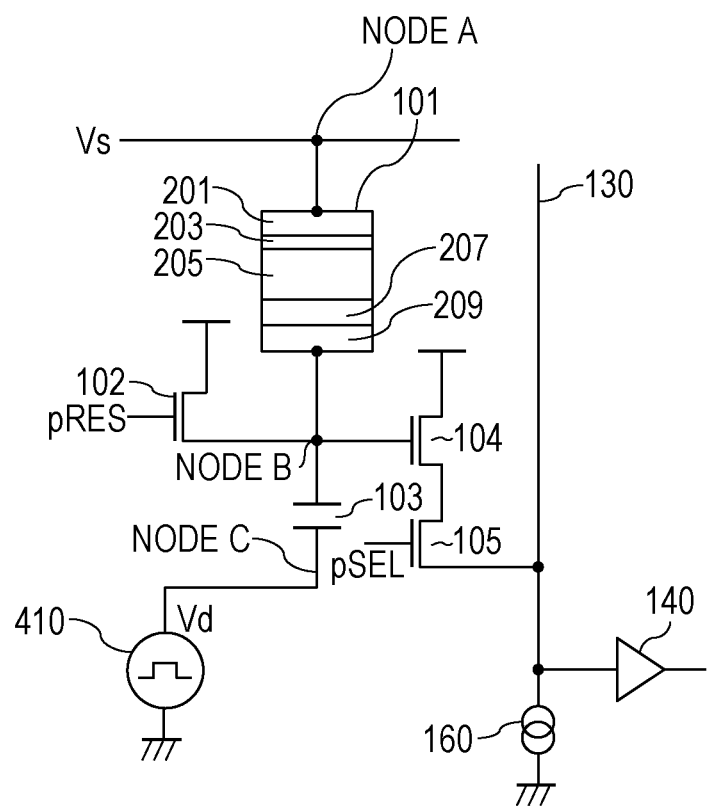
FIG. 8 is a schematic diagram of the configuration of a pixel of a photoelectric conversion device according to a second exemplary embodiment.

FIG. 8 schematically illustrates a configuration of a pixel 100 of a photoelectric conversion device according to this exemplary embodiment. Portions having substantially the same functions as those in FIG. 1A are assigned the same numerals. Equivalent circuits of the photoelectric conversion unit 101 according to this exemplary embodiment are the same as those in the first exemplary embodiment. That is, FIGS. 1B and 1C illustrate example equivalent circuits of the photoelectric conversion unit 101 according to this exemplary embodiment.

In this exemplary embodiment, a voltage Vd from a voltage supply unit 410 is supplied to the second terminal of the first capacitor 103. The voltage supply unit 410 supplies at least a first voltage Vd1 and a second voltage Vd2 different from the first voltage Vd1 to the second terminal of the first capacitor 103.

If signal charges are holes, the second voltage Vd2 is a voltage higher than the first voltage Vd1. If signal charges are holes, for example, the first voltage Vd1 is equal to 0 V, and the second voltage Vd2 is equal to 5 V. If signal charges are electrons, the second voltage Vd2 is a voltage lower than the first voltage Vd1. If signal charges are electrons, for example, the first voltage Vd1 is equal to 5 V, and the second voltage Vd2 is equal to 0 V.

On the other hand, a predetermined voltage Vs is supplied to the first electrode 201 of the photoelectric conversion unit 101. In this exemplary embodiment, a voltage of 3 V is supplied to the first electrode 201 of the photoelectric conversion unit 101. In FIG. 8, the first electrode 201 is included in the node A.

Next, the reset voltage Vres supplied by the reset transistor 102 will be described. If signal charges are holes, the reset voltage Vres is a voltage lower than the voltage Vs supplied to the first electrode 201 of the photoelectric conversion unit 101. If signal charges are electrons, the reset voltage Vres is a voltage higher than the voltage Vs supplied to the first electrode 201 of the photoelectric conversion unit 101.

In this exemplary embodiment, the voltage Vd on the node C is controlled to control the voltage on the node B coupled to the node C via the first capacitor 103. Thus, a direct current relationship in magnitude between the voltage Vd supplied to the node C and the reset voltage Vres or the voltage Vs supplied to the node A is not particularly limited.

Figure 9:
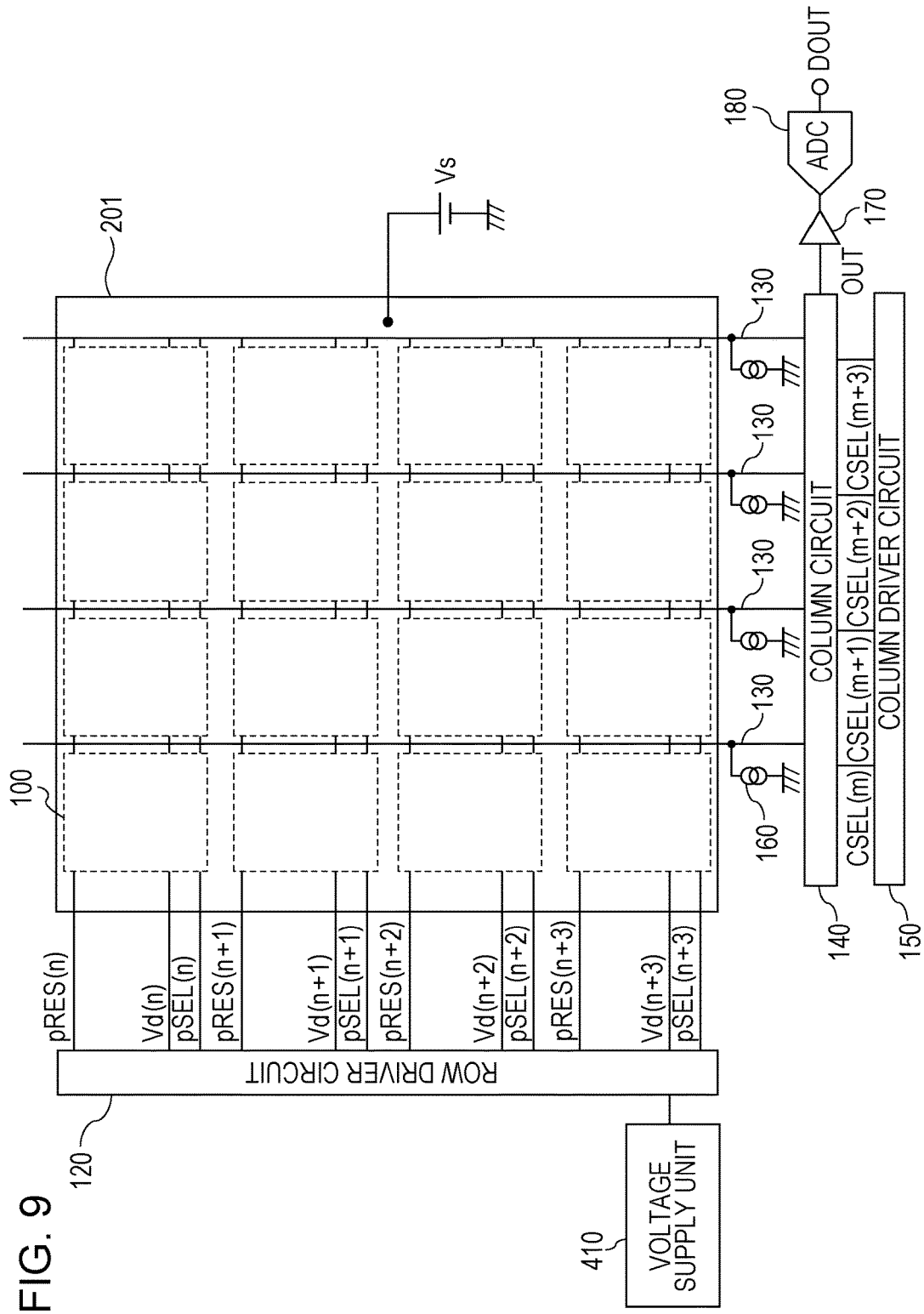
FIG. 9 is a schematic diagram of the overall configuration of the photoelectric conversion device.

FIG. 9 is a schematic diagram of an overall circuit configuration of the photoelectric conversion device according to this exemplary embodiment. Portions having substantially the same functions as those in FIG. 2 are assigned the same numerals.

FIG. 9 schematically illustrates the planar structure of the first electrode 201 of the photoelectric conversion unit 101. The first electrode 201 is included in the node A illustrated in FIG. 8. As illustrated in FIG. 9, photoelectric conversion units 101 of a plurality of pixels 100 in a plurality of rows and a plurality of columns are configured to include a common first electrode 201. The voltage Vs is supplied to the first electrode 201.

In this exemplary embodiment, the voltage Vd to be supplied to the second terminals (the nodes C) of the first capacitors 103 is controlled independently on a row-by-row basis. Thus, the row driver circuit 120 selects a row to which the voltage Vd is supplied from the voltage supply unit 410. Signs indicating rows, such as (n) and (n+1), are assigned to distinguish voltages Vd to be supplied to different rows. In this exemplary embodiment, the configuration described above enables a plurality of pixels 100 to be driven row-by-row.

Column circuits 140 according to this exemplary embodiment have substantially the same configuration as those of the first exemplary embodiment. That is, FIG. 3 illustrates an equivalent circuit of the column circuits 140 according to this exemplary embodiment. Also, similarly to the first exemplary embodiment, each of the column circuits 140 may be an analog-to-digital conversion circuit. In this case, the analog-to-digital conversion circuit includes a holding unit that holds a digital signal, such as a memory or a counter. The holding unit holds digital signals into which a noise signal and an optical signal are converted.

Figure 10:
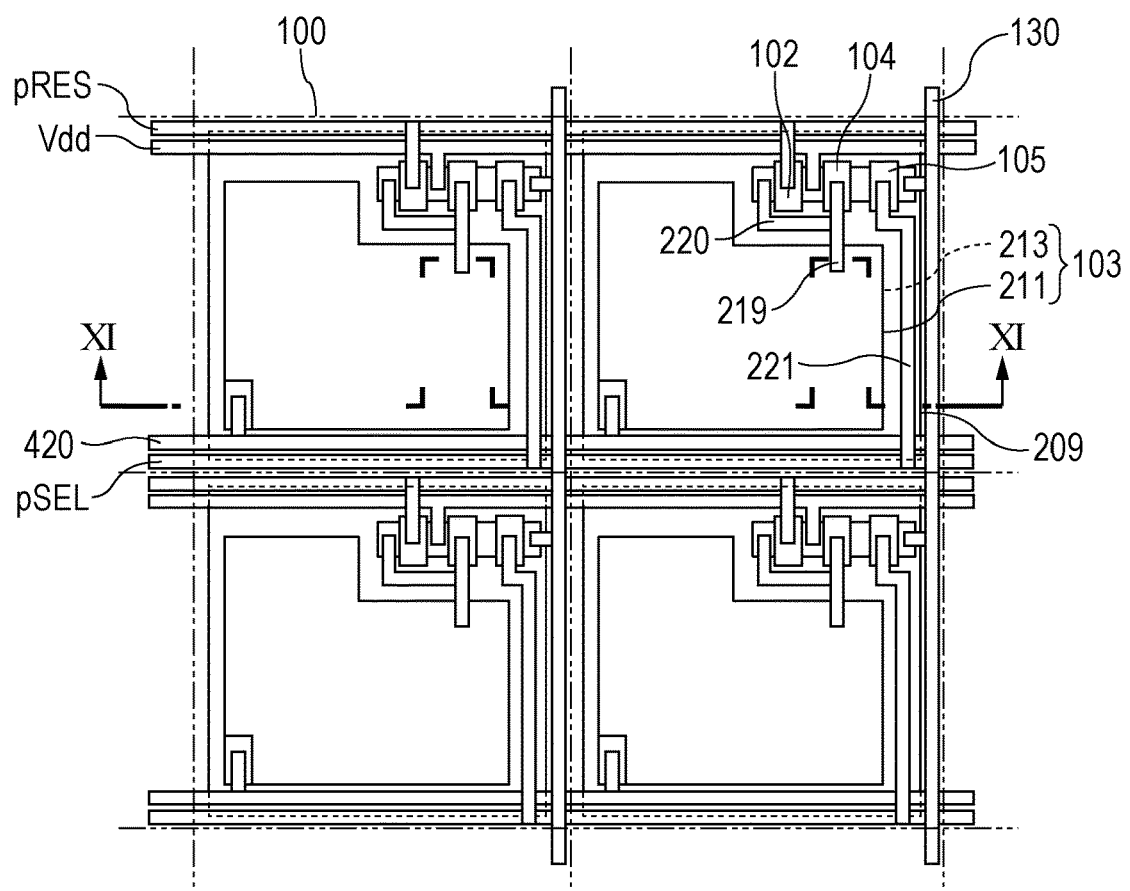
FIG. 10 is a schematic diagram of the planar structure of the photoelectric conversion device.
Figure 11:
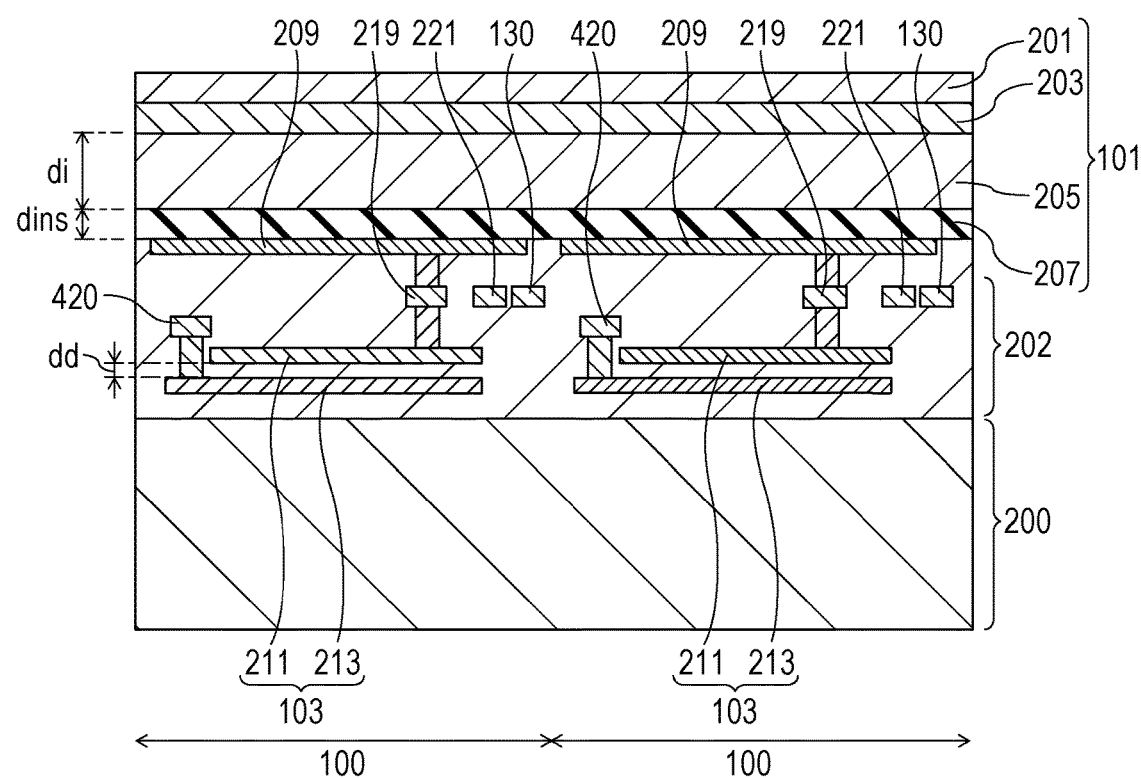
FIG. 11 is a schematic diagram of the cross-sectional structure of the photoelectric conversion device.

Next, the planar structure and cross-sectional structure of the photoelectric conversion device according to this exemplary embodiment will be described. FIG. 10 schematically illustrates the planar structure of the photoelectric conversion device. FIG. 11 schematically illustrates the cross-sectional structure of the photoelectric conversion device. The cross section illustrated in FIG. 11 corresponds to the cross section taken along the line XI-XI in FIG. 10. In FIGS. 10 and 11, portions which are substantially the same as those in FIGS. 4, 5A, and 5B are assigned the same numerals.

As illustrated in FIG. 10 and FIG. 11, the lower electrodes 213 of the first capacitors 103 are connected to conductive members 420. The conductive members 420 form wiring lines through which the voltage Vd from the voltage supply unit 410 is supplied. In this exemplary embodiment, the conductive members 420 are disposed for the respective rows, and the conductive member 420 for a certain row is electrically isolated from the conductive members 420 for the other rows. This configuration enables the voltage Vd on the second terminals (the nodes C) of the first capacitors 103 to be controlled independently on a row-by-row basis.

The structure other than that described above is similar to that of the first exemplary embodiment, and is not described herein.

Next, the operation of each of the photoelectric conversion units 101 according to this exemplary embodiment will be described. FIGS. 12A to 12F schematically illustrate energy bands in each of the photoelectric conversion units 101. In FIGS. 12A to 12F, the energy bands of the first electrode 201, the blocking layer 203, the photoelectric conversion layer 205, the insulating layer 207, and the second electrode 209 are illustrated. The vertical axis in FIGS. 12A to 12F represents the potential of electrons. The potential of electrons increases along the vertical axis in an upward direction in FIGS. 12A to 12F. Accordingly, the voltage decreases along the vertical axis in an upward direction in FIGS. 12A to 12F. For the first electrode 201 and the second electrode 209, the energy level of free electrons is illustrated. For the blocking layer 203 and the photoelectric conversion layer 205, a band gap between the energy level of the conduction band and the energy level of the valence band is illustrated. The potential of the photoelectric conversion layer 205 at the interface between the photoelectric conversion layer 205 and the insulating layer 207 is referred to as the "surface potential of the photoelectric conversion layer 205" or simply as the "surface potential", for convenience.

In the operation of the photoelectric conversion unit 101, the following steps (1) to (6) are repeatedly performed: (1) the reset of the input node of the amplification unit, (2) the readout of a noise signal, (3) the discharge of signal charge from the photoelectric conversion unit, (4) the readout of an optical signal, (5) the reset before accumulation of signal charge is started, and (6) the accumulation of signal charge. In the following, the respective steps will be described.

Figure 12A:
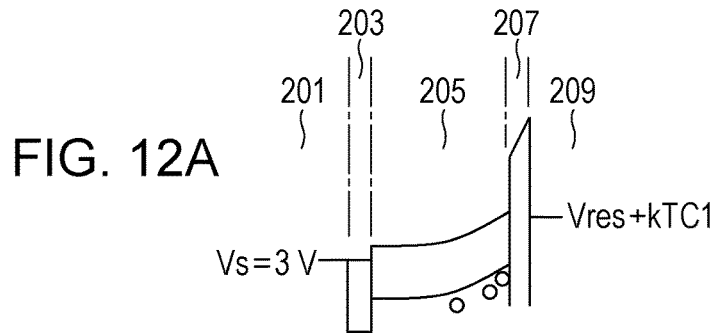
FIGS. 12A to 12F are schematic diagrams of the potential of a photoelectric conversion unit of the photoelectric conversion device.

FIG. 12A illustrates the state of the photoelectric conversion unit 101 in step (1) to step (2). The voltage Vs is supplied to the first electrode 201. The voltage Vs is equal to, for example, 3 V. In the photoelectric conversion layer 205, holes plotted using empty circles are accumulated as signal charges generated during an exposure period. The surface potential of the photoelectric conversion layer 205 changes in the direction in which the surface potential decreases (i.e., in the direction in which voltage increases) in accordance with the number of accumulated holes. In the case of accumulation of electrons, the surface potential changes in the direction in which the surface potential increases (i.e., in the direction in which voltage decreases) in accordance with the number of accumulated electrons. In addition, the first voltage Vd1 is supplied to the node C. The first voltage Vd1 is equal to, for example, 0 V.

In this state, the reset transistor 102 is turned on. Accordingly, the voltage on a node including the second electrode 209, that is, the voltage on the node B illustrated in FIG. 8, is reset to the reset voltage Vres. In this exemplary embodiment, the node B includes the gate of the amplifier transistor 104. Thus, the voltage at the gate of the amplifier transistor 104 is reset. The reset voltage Vres is equal to, for example, 1 V.

After that, the reset transistor 102 is turned off. Accordingly, the node B is brought into an electrically floating state. In this case, reset noise (noise kTC1 illustrated in FIG. 12A) may be generated by the reset transistor 102.

The surface potential of the photoelectric conversion layer 205 may change in accordance with a change in the voltage on the second electrode 209 during the reset operation. In this case, the direction in which the voltage on the second electrode 209 changes is opposite to the direction in which the voltage on the second electrode 209 has changed due to the accumulation of signal charge. For this reason, the holes of the signal charge remain accumulated in the photoelectric conversion layer 205. In addition, the blocking layer 203 prevents injection of holes from the first electrode 201. Thus, the amount of signal charge accumulated in the photoelectric conversion layer 205 does not change.

If the selection transistor 105 is in an on state, the amplifier transistor 104 outputs a noise signal (Vres+kTC1) including the reset noise from the pixel 100. The noise signal is held in the capacitor CTN of the column circuit 140.

Figure 12B:
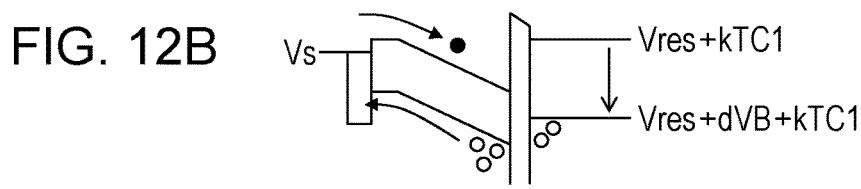
Figure 12C:
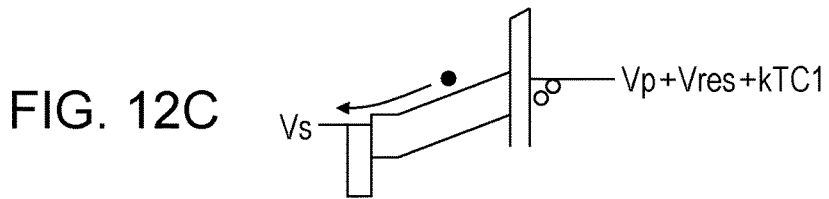

FIGS. 12B and 12C illustrate the state of the photoelectric conversion unit 101 in step (3). First, the second voltage Vd2 is supplied to the node C. Since holes are used as signal charges, the second voltage Vd2 is a voltage higher than the first voltage Vs1. The second voltage Vd2 is equal to, for example, 5 V.

In this case, the voltage on the second electrode 209 (the node B) changes in the same direction as the direction in which the voltage on the node C changes. An amount of change dVB in the voltage on the second electrode 209 is determined in accordance with the ratio of the capacitance value C1 of the first capacitor 103 connected to the second electrode 209 to the capacitance value C2 of the second capacitor 111 included in the photoelectric conversion unit 101. The amount of change dVB in the voltage on the second electrode 209 with respect to an amount of change dVd in the voltage on the node C is given by dVB=dVd×C1/(C1+C2). The node B including the second electrode 209 may also include other capacitance components. The other capacitance components have a much smaller capacitance value than the capacitance value C1 of the first capacitor 103. Thus, the capacitance value of the node B can be regarded as being equal to the capacitance value C1 of the first capacitor 103.

In this exemplary embodiment, the amount of change dVB in the voltage on the second electrode 209 is much larger than the difference (Vs−Vres) between the voltage Vs on the first electrode 201 and the reset voltage Vres. Thus, the potential of the second electrode 209 is lower than the potential of the first electrode 201, and the gradient of the potential of the photoelectric conversion layer 205 is inverted. Accordingly, an electron plotted using a solid circle is injected into the photoelectric conversion layer 205 from the first electrode 201. In addition, some or all of the holes accumulated in the photoelectric conversion layer 205 as signal charges move to the blocking layer 203. The holes that have moved are recombined with the majority carriers in the blocking layer 203 and disappear. Consequently, the holes in the photoelectric conversion layer 205 are discharged from the photoelectric conversion layer 205. For the depletion of the entire photoelectric conversion layer 205, all the holes accumulated as signal charges are discharged.

Then, in the state illustrated in FIG. 12C, the first voltage Vd1 is supplied to the node C. Accordingly, the gradient of the potential of the photoelectric conversion layer 205 is inverted again. Thus, the electrons injected into the photoelectric conversion layer 205 in the state illustrated in FIG. 12B are discharged from the photoelectric conversion layer 205. On the other hand, the blocking layer 203 prevents injection of holes into the photoelectric conversion layer 205 from the first electrode 201. Accordingly, the surface potential of the photoelectric conversion layer 205 changes in accordance with the number of holes that have been accumulated. In accordance with the change in surface potential, the voltage on the second electrode 209 changes from the reset state by a voltage Vp corresponding to the number of holes that have disappeared. That is, the voltage Vp corresponding to the number of holes accumulated as signal charges appears at the node B. The voltage Vp corresponding to the number of accumulated holes is referred to as an "optical signal component".

In the state illustrated in FIG. 12C, the selection transistor 105 is turned on. Accordingly, the amplifier transistor 104 outputs an optical signal (Vp+Vres+kTC1) from the pixel 100. The optical signal is held in the capacitor CTS of the column circuit 140. The difference between the noise signal (Vres+kTC1) read out in step (2) and the optical signal (Vp+Vres+kTC1) read out in step (4) is a signal based on the voltage Vp corresponding to the accumulated signal charge.

Figure 12D:
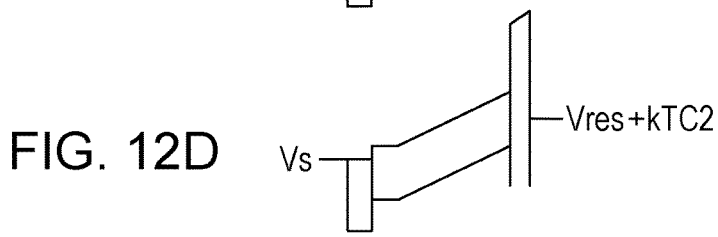

FIG. 12D illustrates the state of the photoelectric conversion unit 101 in step (5). The reset transistor 102 is turned on, and the voltage on the node B is reset to the reset voltage Vres. After that, the reset transistor 102 is turned off. In the way described above, the node B is reset before the accumulation of signal charge is started, enabling the optical signal component for the preceding frame which has been accumulated in the node B to be removed. Accordingly, the dynamic range may be prevented from being narrowed in accordance with the accumulation of optical signals in the node B. Note that the reset before accumulation of signal charge is started in step (5) may not necessarily be performed.

Also in this case, reset noise (noise kTC2 illustrated in FIG. 12D) may be generated by the reset transistor 102. The generated reset noise can be removed through the reset operation in step (1) after the completion of the accumulation period.

Figure 12E:
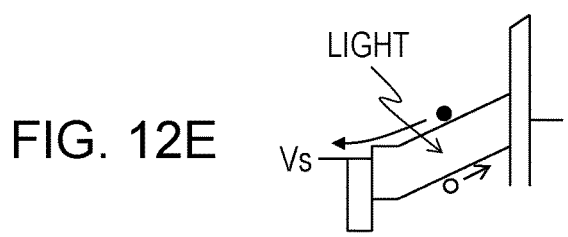
Figure 12F:
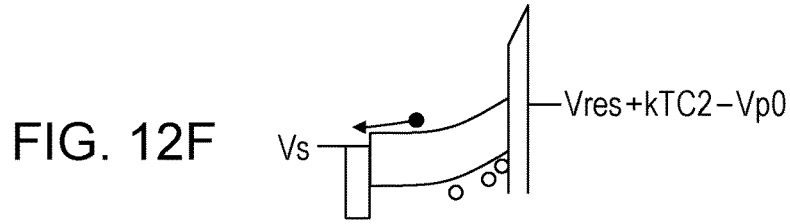

FIGS. 12E and 12F illustrate the state of the photoelectric conversion unit 101 in step (6). The voltage Vs is supplied to the first electrode 201, and the reset voltage Vres is supplied to the node B. The reset voltage Vres is lower than the voltage Vs on the first electrode 201. Thus, the electrons in the photoelectric conversion layer 205 are discharged to the first electrode 201. In contrast, the holes in the photoelectric conversion layer 205 move to the interface between the photoelectric conversion layer 205 and the insulating layer 207. However, the holes are not movable to the insulating layer 207, and are thus accumulated in the photoelectric conversion layer 205. In addition, as described previously, the blocking layer 203 prevents the holes from being injected into the photoelectric conversion layer 205. In this state, when light enters the photoelectric conversion layer 205, only the holes in the electron-hole pairs generated by photoelectric conversion are accumulated in the photoelectric conversion layer 205 as signal charges. After the accumulation operation has been performed for a certain period, the operations in steps (1) to (6) are repeatedly performed.

The accumulated holes cause a change in the surface potential of the photoelectric conversion layer 205. In accordance with the change in surface potential, the voltage on the second electrode 209 increases. This increase is represented by Vp0 in FIG. 12F. In the reset operation in FIG. 12A, as described above, the voltage on the second electrode 209 changes so as to cancel out the change of the voltage Vp0. That is, the voltage on the second electrode 209 decreases. Accordingly, the surface potential of the photoelectric conversion layer 205 changes in the direction in which the surface potential increases.

If signal charges are electrons, the second voltage Vd2 is a voltage lower than the first voltage Vd1. Thus, the gradient of the potential illustrated in FIGS. 12A to 12F is inverted. The other operations are substantially the same.

In the operation described with reference to FIGS. 12A to 12F, the gradient of the potential of the photoelectric conversion layer 205 is inverted in the state illustrated in FIG. 12B, enabling the discharge of the accumulated holes. Non-inversion of the gradient of the potential of the photoelectric conversion layer 205 causes the occurrence of electric charge that is not discharged. Thus, noise may occur.

Here, as the amount by which the amount of change dVB in the voltage on the second electrode 209 (the node B) is larger than the difference (Vs−Vres) between the voltage Vs on the first electrode 201 and the reset voltage Vres increases, the potential gradient is more likely to be inverted. That is, as the amount by which the amount of change dVB in the voltage on the second electrode 209 is larger than the difference (Vs−Vres) between the voltage Vs on the first electrode 201 and the reset voltage Vres increases, further noise reduction is achievable.

As described above, there is a relationship represented by dVB=dVd×C1/(C1+C2) between the amount of change dVd in the voltage on the node C and the amount of change dVB in the voltage on the node B. That is, as the capacitance value C1 of the node B increases, the amount of change dVB in the voltage on the node B increases.

In this exemplary embodiment, the first capacitor 103 is connected to the second electrode 209. Thus, the capacitance value C1 of the node B can be increased. This configuration enables an increase in the amount of change dVB in the voltage on the node B. Consequently, depletion of the photoelectric conversion layer 205 is more likely to be achieved, resulting in a reduction in electric charge that is not discharged. According to this exemplary embodiment, therefore, noise reduction may be achieved.

A description will be given of a comparative example in which the first capacitor 103 is not connected to the node B. In this configuration, the node B has a capacitance that may include a capacitance component due to a PN junction in a semiconductor region and a parasitic capacitance component of a wiring line. Since the capacitance components described above are negligibly smaller than the capacitance value C2 of the second capacitor 111 included in the photoelectric conversion unit 101, the value given by C1/(C1+C2) is substantially equal to zero. Thus, even if the voltage Vd on the node C is changed, the voltage on the node B does not substantially change. In this case, the gradient of the potential may not be inverted in the state illustrated in FIG. 12B, resulting in a possibility that some of the holes accumulated as signal charges will not be discharged. In this exemplary embodiment, by contrast to the comparative example, the amount of signal charge that is not discharged can be reduced, resulting in noise reduction.

A description will now be given of the relationship among the capacitance value C1 of the first capacitor 103, the capacitance value C2 of the second capacitor 111 included in the photoelectric conversion unit 101, and the voltage supplied to each unit. In this exemplary embodiment, the capacitance value C1 and the capacitance value C2 are represented by Expression (4) and Expression (1) in the first exemplary embodiment, respectively. A detailed description is not given here.

In this exemplary embodiment, the voltage Vd on the nodes C is controlled using the first voltage Vd1 and the second voltage Vd2 to accumulate signal charge and discharge the signal charge due to the depletion of the photoelectric conversion layer 205. The capacitance value C1 of the first capacitor 103 and the capacitance value C2 of the second capacitor 111 satisfy the following relationship, thereby achieving a reduction in the electric charge remaining in the photoelectric conversion layer 205 during the discharge of signal charge described above. An exemplary embodiment in which signal charges are holes will be described first.

In the following, for simplicity, the capacitance value C1 of the first capacitor 103 is k times as large as the capacitance value C2 of the second capacitor 111. That is, the capacitance value C1 and the capacitance value C2 have a relationship of Expression (18) as follows:

$$C1 = k \times C2. \tag{18}$$

As described previously, the amount of change dVd in the voltage on the node C and the amount of change dVB in the voltage on the second electrode 209 (the node B) have a relationship given by Expression (19) as follows:

$$dVB = dVd \times C1/(C1+C2). \tag{19}$$

Expression (18) and Expression (19) yield Expression (20) as follows:

$$dVB = dVd \times k/(1+k). \tag{20}$$

To accumulate holes as signal charges, it is desirable that the voltage Vs supplied to the first electrode 201 (the node A) and the reset voltage Vres satisfy a relationship of Expression (21) as follows:

$$Vs > Vres. \tag{21}$$

To transfer the holes of the signal charge, it is desirable that the voltage Vs on the first electrode 201 (the node A), the reset voltage Vres, and the amount of change dVB in the voltage on the second electrode 209 satisfy a relationship of Expression (22) as follows:

$$Vs < Vres + dVB. \tag{22}$$

If the relationship of Expression (21) is satisfied, the gradient of the potential that allows holes to drift toward the insulating layer 207 can be formed in the photoelectric conversion layer 205. If the relationship of Expression (22) is satisfied, it is easy to reverse the gradient of the potential of the photoelectric conversion layer 205.

Expression (20) and Expression (22) yield Expression (23).

$$Vs - Vres < dVd \times k/(1+k) \tag{23}$$

In an exemplary embodiment in which signal charges are holes, the second voltage Vd2 is higher than the first voltage Vd1. That is, the amount of change dVd (=Vd2−Vd1) in the voltage on the node C has a positive value. Accordingly, dividing both sides of Expression (23) by dVd does not change the orientation of the inequality sign.

Accordingly, Expression (23) yields a relational expression given by Expression (24) below for a capacity ratio k of the capacitance value C1 and the capacitance value C2.

$$1 - \frac{1}{1+k} > \frac{Vs - Vres}{dVd} \tag{24}$$

If the relationship of Expression (24) is satisfied, the amount of electric charge that is not discharged can be reduced. Accordingly, noise reduction may be achieved.

In this exemplary embodiment, the voltage Vs on the first electrode 201 is equal to 3 V, and the reset voltage Vres is equal to 1 V. Since the first voltage Vd1 is equal to 0 V and the second voltage Vs2 is equal to 5 V, the amount of change dVd in the voltage on the node C is equal to 5 V. Thus, k>⅔ is set. Specifically, in this exemplary embodiment, the capacitance value C1 of the first capacitor 103 is equal to 4 fF, and the capacitance value C2 of the second capacitor 111 is equal to 1 fF. That is, k=4 is obtained. This configuration may achieve more noise reduction.

In this exemplary embodiment, the area Sd of either the upper electrode 211 or the lower electrode 213 of the first capacitor 103 in plan view and the area Ss of the second electrode 209 in plan view satisfy a relationship of Sd>0.5× Ss. This configuration may make it easy to obtain the relationship of the capacity ratio described above.

Further, as the value k increases, the noise reduction effect increases. Accordingly, in a case where the capacitance value C1 of the first capacitor 103 is equal to or greater than the capacitance value C2 of the second capacitor 111, the noise reduction effect may further be increased.

The amount of change dVd in the voltage on the node C is given by dVd=Vd2−Vd1 using the first voltage Vd1 and the second voltage Vd2. Further, the left-hand side of Expression (24) can be rewritten as C1/(C1+C2) using Expression (18). Accordingly, Expression (24) is modified into Expression (25).

$$\frac{C1}{C1+C2} > \frac{Vs - Vres}{Vd2 - Vd1} \tag{25}$$

An exemplary embodiment in which signal charges are electrons will now be described. If signal charges are electrons, the orientations of the inequality signs in Expression (21) and Expression (22) are changed. Accordingly, the orientation of the inequality sign in Expression (23) is also changed. That is, if signal charges are electrons, Expression (26) below is obtained.

$$Vs - Vres > dVd \times k/(1+k) \tag{26}$$

Note that, in an exemplary embodiment in which signal charges are electrons, the second voltage Vd2 is lower than the first voltage Vd1. That is, the amount of change dVd (=Vd2−Vd1) in the voltage on the node C has a negative value. Accordingly, dividing both sides of Expression (26) by dVd changes the orientation of the inequality sign. Consequently, Expression (24) and Expression (25) are obtained as in the case where signal charges are holes.

Here, the relationship given by Expression (25) will be described. As the reset voltage Vres approaches the voltage Vs supplied to the first electrode 201 of the photoelectric conversion unit 101, the value on the right-hand side decreases. That is, even if the capacitance value C1 of the first capacitor 103 is small, the gradient of the potential of the photoelectric conversion layer 205 can be inverted. If the difference between the reset voltage Vres and the voltage Vs supplied to the first electrode 201 is small, the amount of electric charge that can be accumulated in the photoelectric conversion layer 205 is small.

In contrast, as the difference between the reset voltage Vres and the voltage Vs increases, the value on the right-hand side increases. That is, a large value is used for the capacitance value C1 of the first capacitor 103. In this case, the difference between the reset voltage Vres and the first voltage Vs1 is large. Thus, the amount of electric charge that can be accumulated in the photoelectric conversion layer 205 can be increased.

In terms of the balance between the saturated amount of electric charge and the capacitance value C1 of the first capacitor 103, it is preferable that the difference between the reset voltage Vres and the voltage Vs be in a range of 20% to 80% of the difference between the first voltage Vs1 and the second voltage Vs2. For example, if the first voltage Vs1 is equal to 0 V and the second voltage Vs2 is equal to 5 V, it is desirable that the difference from the reset voltage Vres be in a range of 1 V to 4 V.

In particular, an increase in the difference between the first voltage Vd1 and the second voltage Vd2 may reduce the capacitance value C1 of the first capacitor 103 even if the difference between the reset voltage Vres and the voltage Vs is large. In a case where the photoelectric conversion device is used as an image sensor of a camera or the like, however, a low power supply voltage is used for a reduction in power consumption. For example, the power supply voltage supplied to an image sensor is typically less than or equal to 5 V. Accordingly, values less than or equal to 5 V are also used for the voltages in Expression (24) to Expression (25). It is thus difficult to increase the difference between the first voltage Vd1 and the second voltage Vd2. In this case, the capacitance value C1 of the first capacitor 103 and the capacitance value C2 of the second capacitor 111 satisfy the relationship described above, enabling noise reduction with low-voltage driving of the photoelectric conversion device.

As described above, noise reduction may be achieved using the relationship between the capacitance value C1 of the first capacitor 103 and the capacitance value C2 of the second capacitor 111 included in the photoelectric conversion unit 101.

The numerical values given in the foregoing are merely examples, and are not intended to be limiting. Defect energy levels and the like may be present at the interface between the photoelectric conversion layer 205 and the insulating layer 207. In this case, it may be sufficient to take into account the flatband voltage by using a known technique.

Figure 13:
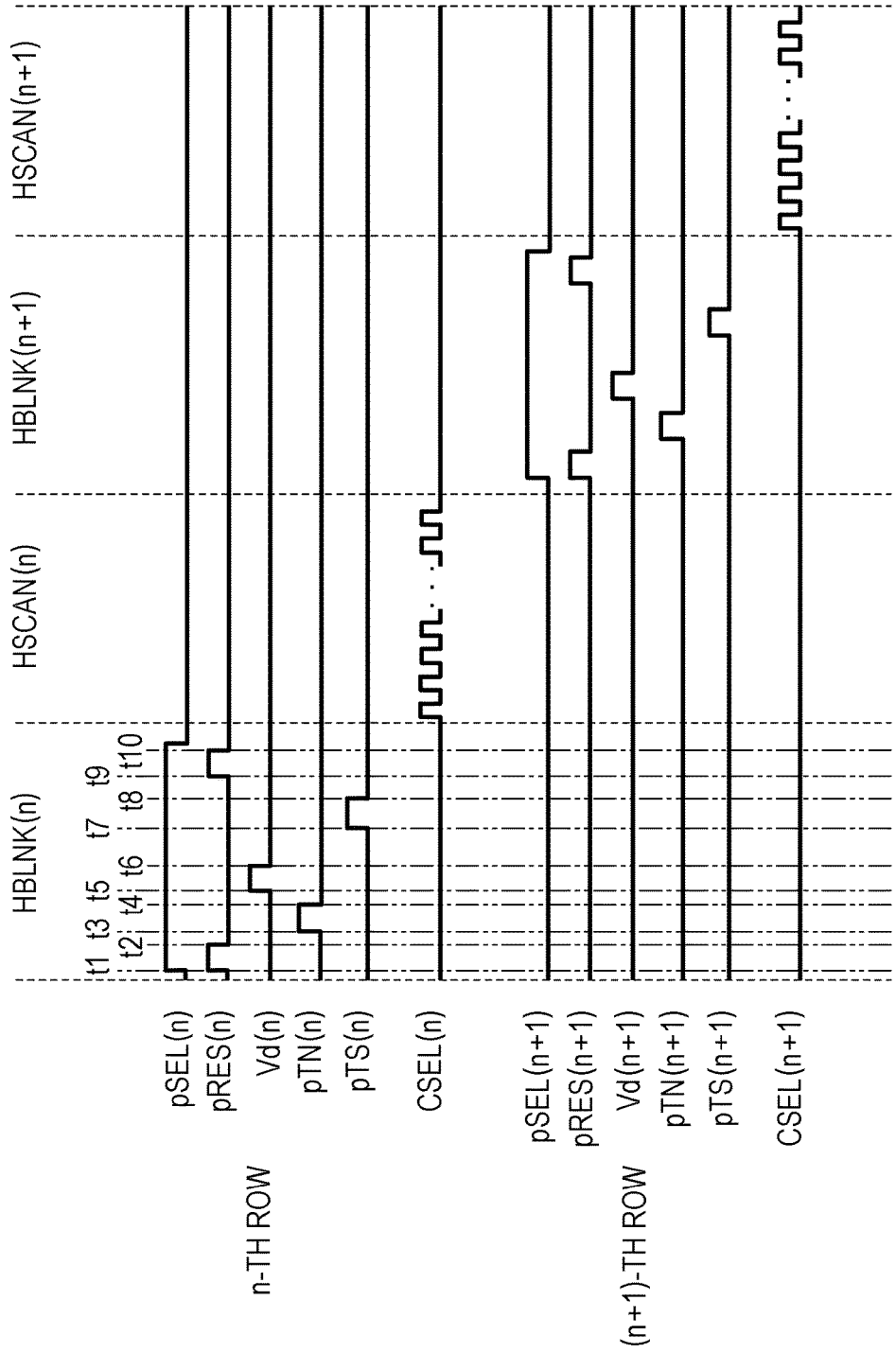
FIG. 13 is a diagram illustrating a timing chart of drive signals used in the photoelectric conversion device.

Next, a method for driving the photoelectric conversion device according to this exemplary embodiment will be described. FIG. 13 illustrates a timing chart of drive signals used in the photoelectric conversion device according to this exemplary embodiment. In FIG. 13, drive signals for signal readout for the n-th row and the (n+1)-th row, or two rows in total, are illustrated.

The difference from the driving method according to the first exemplary embodiment is that a voltage signal Vd is supplied to the nodes C illustrated in FIG. 8. In FIG. 13, the timing chart of the voltage signal Vd is illustrated. The voltage signal Vd includes the first voltage Vd1 and the second voltage Vd2. The period during which the voltage signal Vs is the first voltage Vs1 in the first exemplary embodiment corresponds to a period during which the voltage signal Vd is the first voltage Vd1 in this exemplary embodiment. The period during which the voltage signal Vs is the second voltage Vs2 in the first exemplary embodiment corresponds to a period during which the voltage signal Vd is the second voltage Vd2 in this exemplary embodiment.

The timing chart of the other drive signals is substantially the same as that in FIG. 7. Thus, a detailed description is not given here.

In the photoelectric conversion device according to this exemplary embodiment, as described above, the photoelectric conversion layer 205 includes the quantum dots 10. This configuration enables a reduction in the defect energy levels in the photoelectric conversion layer for the following reasons. Because the size of the quantum dots is small, the lattice defects in the quantum dots can be reduced. Consequently, noise reduction may be achieved.

Third Exemplary Embodiment

Another exemplary embodiment will be described. This exemplary embodiment is different from the first exemplary embodiment and the second exemplary embodiment in that a switch is disposed between the photoelectric conversion unit and the input node of the amplification unit. Thus, only portions different from the first exemplary embodiment or the second exemplary embodiment are described. Portions that are substantially the same as those in any of the first exemplary embodiment and the second exemplary embodiment are not described.

Figure 14:
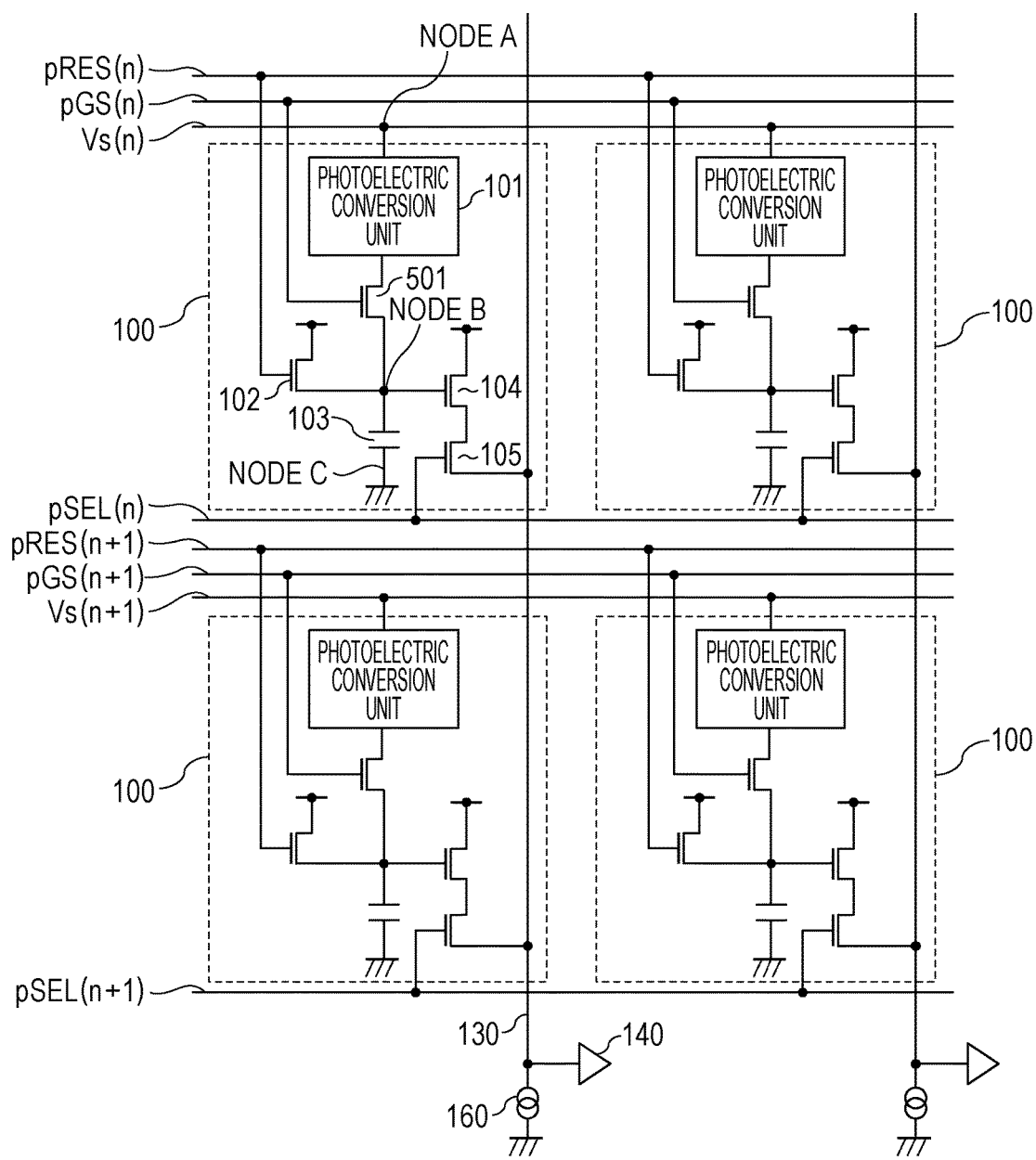
FIG. 14 is a schematic diagram of the configuration of a pixel of a photoelectric conversion device according to a third exemplary embodiment.

FIG. 14 schematically illustrates the configuration of pixels 100 of a photoelectric conversion device according to this exemplary embodiment. In FIG. 14, four pixels 100 arranged in two rows and two columns are illustrated. Portions having substantially the same functions as those in FIG. 1A are assigned the same numerals. Each of the photoelectric conversion units 101 has a structure similar to that in the first exemplary embodiment. Thus, the cross-sectional structure of the photoelectric conversion units 101 is not illustrated in FIG. 14.

In this exemplary embodiment, switches 501 are disposed in electrical paths between the photoelectric conversion units 101 and the first capacitors 103. In other words, the first capacitors 103 are electrically connected to the photoelectric conversion units 101 via the switches 501. The switches 501 are also disposed in electrical paths between the photoelectric conversion units 101 and the amplifier transistors 104. In other words, the amplifier transistors 104 are electrically connected to the photoelectric conversion units 101 via the switches 501. The gates of the amplifier transistors 104 and the first terminals of the first capacitors 103 are included in the nodes B.

The switches 501 control electrical conduction between the photoelectric conversion units 101 and the nodes B. Turning off both the switches 501 and the reset transistors 102 brings the nodes B into an electrically floating state.

A drive signal pGS is supplied to the switches 501. Signs indicating rows, such as (n) and (n+1), are assigned to distinguish drive signals pGS to be supplied to different rows.

The configuration of each of the pixels 100 according to this exemplary embodiment is substantially the same as that in the first exemplary embodiment, except that the switch 501 is disposed. Also, the overall configuration of the photoelectric conversion device according to this exemplary embodiment is also substantially the same as that in the first exemplary embodiment.

The configuration described above enables the exposure periods for all rows to coincide. A so-called global electronic shutter is achieved. Since the drive signal pGS is supplied independently on a row-by-row basis, the switching between a global electronic shutter operation mode and a rolling shutter operation mode is also achieved.

In this exemplary embodiment, as illustrated in FIG. 14, the voltage Vs from the voltage supply unit 110 is supplied to the nodes A to which the first terminals of the photoelectric conversion units 101 are connected. Similarly to the first exemplary embodiment, the voltage supply unit 110 controls the voltage on the nodes A using at least the first voltage Vs1 and the second voltage Vs2. This configuration enables the accumulation of electric charge in the photoelectric conversion units 101 and the discharge or transfer of the electric charge from the photoelectric conversion units 101.

Figure 15:
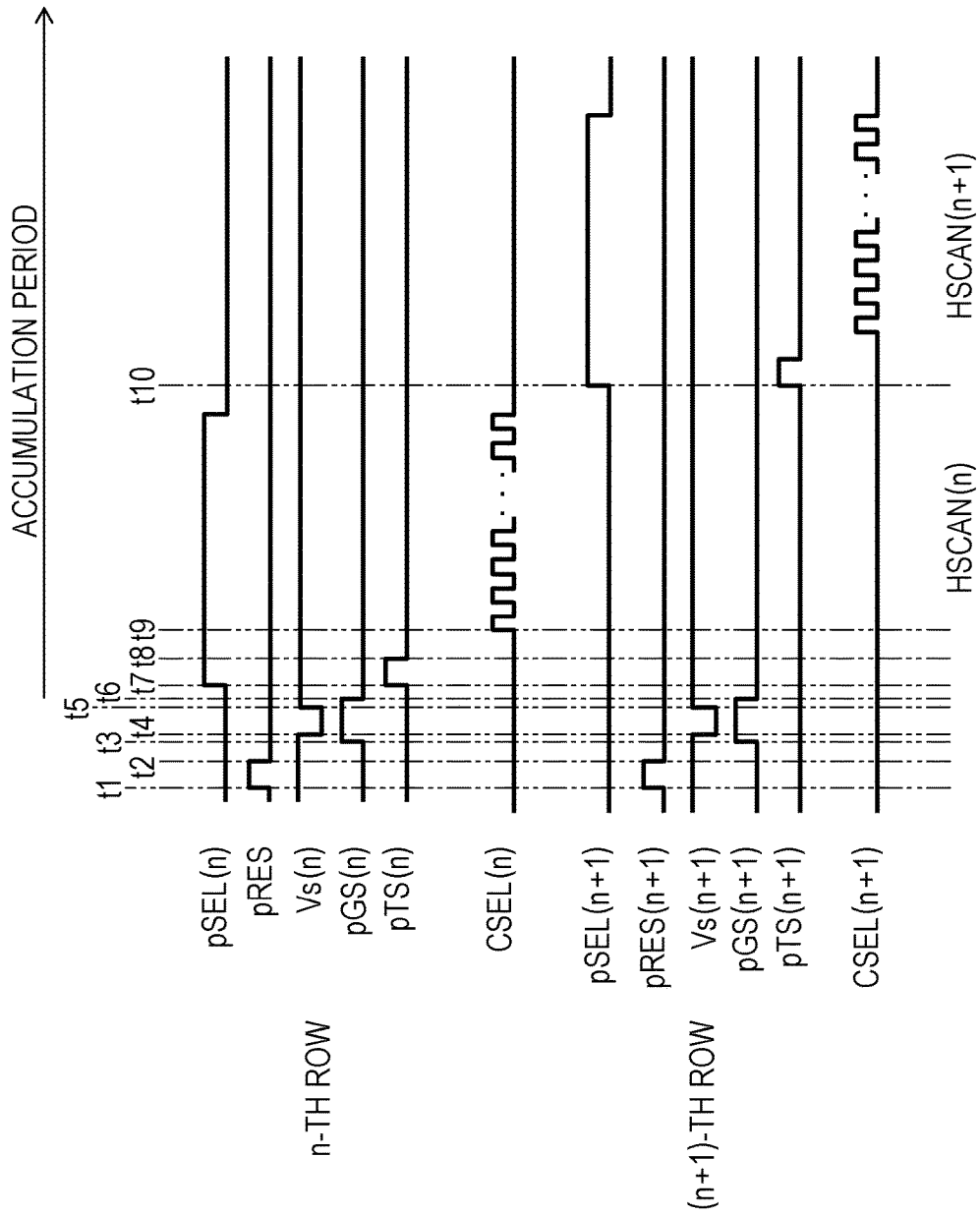
FIG. 15 is a diagram illustrating a timing chart of drive signals used in the photoelectric conversion device.

Next, a method for driving the photoelectric conversion device according to this exemplary embodiment will be described. FIG. 15 illustrates a timing chart of drive signals used in the photoelectric conversion device according to this exemplary embodiment. In FIG. 15, drive signals for signal readout for the n-th row and the (n+1)-th row, or two rows in total, are illustrated.

The difference from the driving method according to the first exemplary embodiment is that the drive signal pGS is supplied to the switch 501. In FIG. 15, the timing chart of the drive signal pGS is illustrated. When the drive signal pGS is in high level, the switch 501 is turned on. When the drive signal pGS is in low level, the switch 501 is turned off.

The photoelectric conversion device according to this exemplary embodiment is configured to perform a global electronic shutter operation. Before time t1, the photoelectric conversion units 101 of the pixels 100 in the n-th row and the photoelectric conversion units 101 of the pixels 100 in the (n+1)-th row accumulate signal charge. Before time t1, furthermore, the voltage signal Vs(n) for the n-th row and the voltage signal Vs(n+1) for the (n+1)-th row are each equal to the first voltage Vs1.

At time t1, the drive signal pRES(n) and the drive signal pRES(n+1) rise to a high level, and the reset transistors 102 of the pixels 100 in the n-th row are turned on. Accordingly, the voltage on the nodes B of the pixels 100 in the n-th row and the voltage on the nodes B of the pixels 100 in the (n+1)-th row are each reset to the reset voltage Vres. After that, at time t2, the drive signal pRES(n) and the drive signal pRES(n+1) fall to a low level, and the reset transistors 102 of the pixels 100 are turned off.

At time t3, the drive signal pGS(n) and the drive signal pGS(n+1) rise to a high level. Accordingly, the switches 501 are turned on. Thus, each of the pixels 100 according to this exemplary embodiment has the equivalent circuit illustrated in FIG. 1B or 1C.

At time t4, the voltage signal Vs(n) and the voltage signal Vs(n+1) transition from the first voltage Vs1 to the second voltage Vs2. Subsequently, at time t5, the voltage signal Vs(n) and the voltage signal Vs(n+1) transition from the second voltage Vs2 to the first voltage Vs1. Through the operation from time t4 to time t5, the signal charge is transferred. Accordingly, the voltage Vp corresponding to the amount of accumulated signal charge is generated in the nodes B. The operation at this time is substantially the same as that described in the first exemplary embodiment with reference to FIGS. 6A to 6F. That is, the state of the energy band of each of the photoelectric conversion units 101 at this time is illustrated in FIG. 6B and FIG. 6C.

At time t6, the drive signal pGS(n) and the drive signal pGS(n+1) fall to a low level. Accordingly, the switches 501 are turned off. This results in the disconnection of electrical conduction between the photoelectric conversion units 101 and the nodes B. Thus, while the nodes B hold the voltage Vp corresponding to the amount of signal charge for the preceding frame, the photoelectric conversion units 101 can accumulate signal charge for the subsequent frame. In this exemplary embodiment, the pixels 100 in a plurality of rows are capable of performing the operation described above in parallel. That is, the photoelectric conversion units 101 of the pixels 100 in a plurality of rows are capable of simultaneously starting the accumulation of signal charge.

In the subsequent operation, optical signals are read out row-by-row. At time t7, the drive signal pSEL(n) rises to a high level. At time t7, the drive signal pTS(n) also rises to a high level. Accordingly, the amplifier transistors 104 of the pixels 100 in the n-th row output an optical signal. The optical signals output from the pixels 100 in the n-th row are held in the capacitors CTS. The optical signals held in the capacitors CTS are output to the output unit 170 on a column-by-column basis after time t9.

At time t10, the readout of optical signals for the (n+1)-th row is started. This operation is similar to that for the n-th row, and is not described herein.

Through the operation described above, signal readout based on the global electronic shutter operation is achieved. In FIG. 15, only the drive signals for the n-th row and the (n+1)-th row are illustrated. Note that the operation from time t1 to time t6 may be performed simultaneously for all rows.

In this exemplary embodiment, furthermore, the drive signals illustrated in FIG. 7 may be supplied while the drive signal pGS is kept at a high level. This enables signal readout based on the rolling shutter operation in a way similar to that in the first exemplary embodiment.

Also in this exemplary embodiment, the photoelectric conversion layer 205 includes the quantum dots 10. Thus, a noise reduction effect may be achieved.

Fourth Exemplary Embodiment

Another exemplary embodiment will be described. This exemplary embodiment is different from the first exemplary embodiment and the second exemplary embodiment in that a switch is disposed between the photoelectric conversion unit and the input node of the amplification unit. The difference between this exemplary embodiment and the third exemplary embodiment is as follows: In the third exemplary embodiment, the voltage on the node A is controlled, whereas, in this exemplary embodiment, the voltage on the node C is controlled. Thus, only portions different from the first exemplary embodiment to the third exemplary embodiment are described. Portions that are substantially the same as those in any of the first exemplary embodiment to the third exemplary embodiment are not described.

Figure 16:
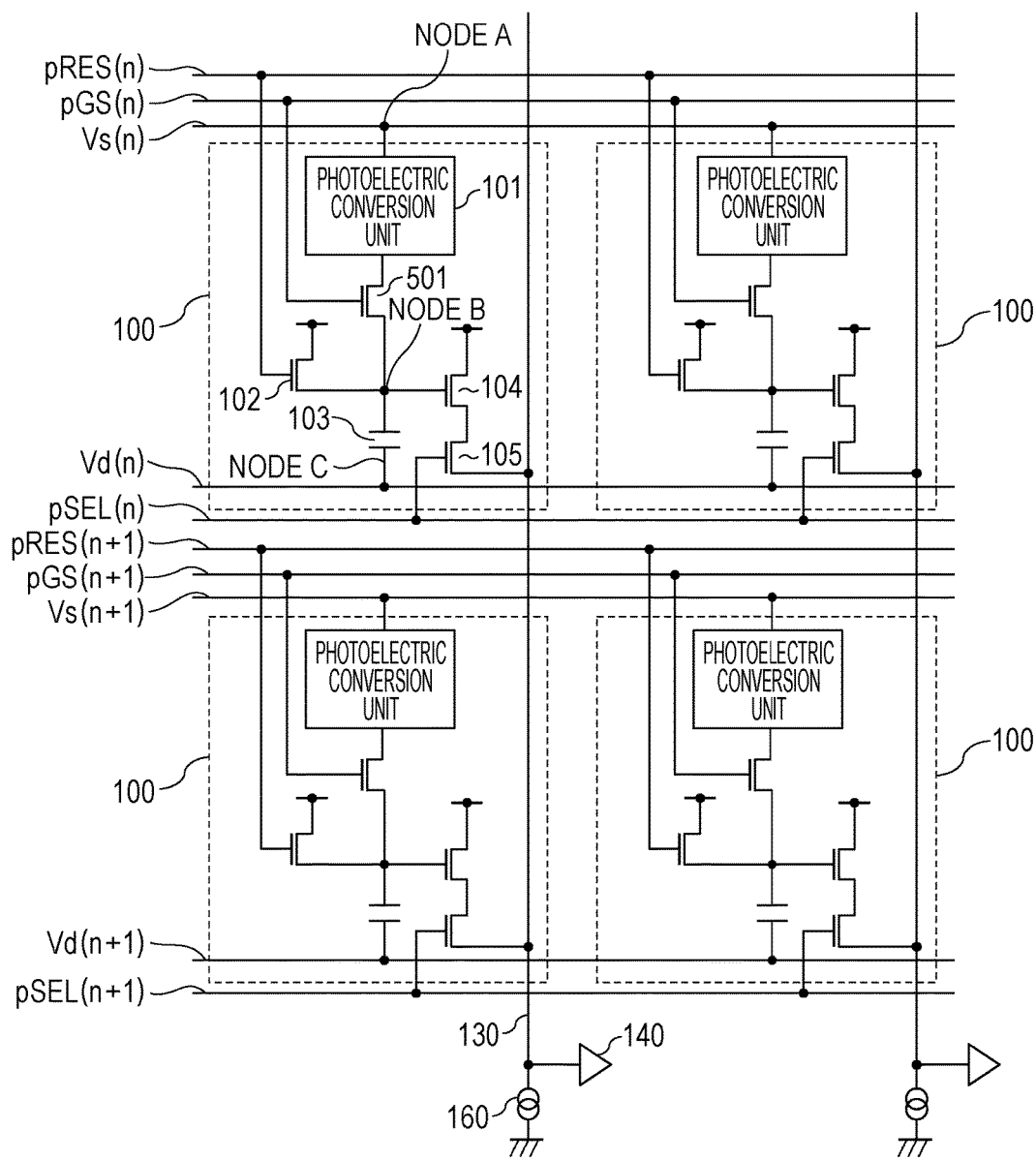
FIG. 16 is a schematic diagram of the configuration of a pixel of a photoelectric conversion device according to a fourth exemplary embodiment.

FIG. 16 schematically illustrates the configuration of pixels 100 of a photoelectric conversion device according to this exemplary embodiment. In FIG. 16, four pixels 100 arranged in two rows and two columns are illustrated. Portions having substantially the same functions as those in FIG. 8 are assigned the same numerals. Each of the photoelectric conversion units 101 has a structure similar to that in the second exemplary embodiment. Thus, the cross-sectional structure of the photoelectric conversion units 101 is not illustrated in FIG. 16.

In this exemplary embodiment, switches 501 are disposed in electrical paths between the photoelectric conversion units 101 and the first capacitors 103. In other words, the first capacitors 103 are electrically connected to the photoelectric conversion units 101 via the switches 501. The switches 501 are also disposed in electrical paths between the photoelectric conversion units 101 and the amplifier transistors 104. In other words, the amplifier transistors 104 are electrically connected to the photoelectric conversion units 101 via the switches 501. The gates of the amplifier transistors 104 and the first terminals of the first capacitors 103 are included in the nodes B.

The switches 501 control electrical conduction between the photoelectric conversion units 101 and the nodes B. Turning off both the switches 501 and the reset transistors 102 brings the nodes B into an electrically floating state.

A drive signal pGS is supplied to the switches 501. Signs indicating rows, such as (n) and (n+1), are assigned to distinguish drive signals pGS to be supplied to different rows.

The configuration of each of the pixels 100 according to this exemplary embodiment is substantially the same as that in the second exemplary embodiment, except that the switch 501 is disposed. Also, the overall configuration of the photoelectric conversion device according to this exemplary embodiment is also substantially the same as that in the second exemplary embodiment.

The configuration described above enables the exposure periods for all rows to coincide. A so-called global electronic shutter is achieved. Since the drive signal pGS is supplied independently on a row-by-row basis, the switching between a global electronic shutter operation mode and a rolling shutter operation mode is also achieved.

In this exemplary embodiment, as illustrated in FIG. 16, the voltage Vd from the voltage supply unit 410 is supplied to the nodes C coupled to the nodes B via the first capacitors 103. Similarly to the second exemplary embodiment, the voltage supply unit 410 controls the voltage on the nodes C using at least the first voltage Vd1 and the second voltage Vd2. This configuration enables the accumulation of electric charge in the photoelectric conversion units 101 and the discharge or transfer of the electric charge from the photoelectric conversion units 101.

Figure 17:
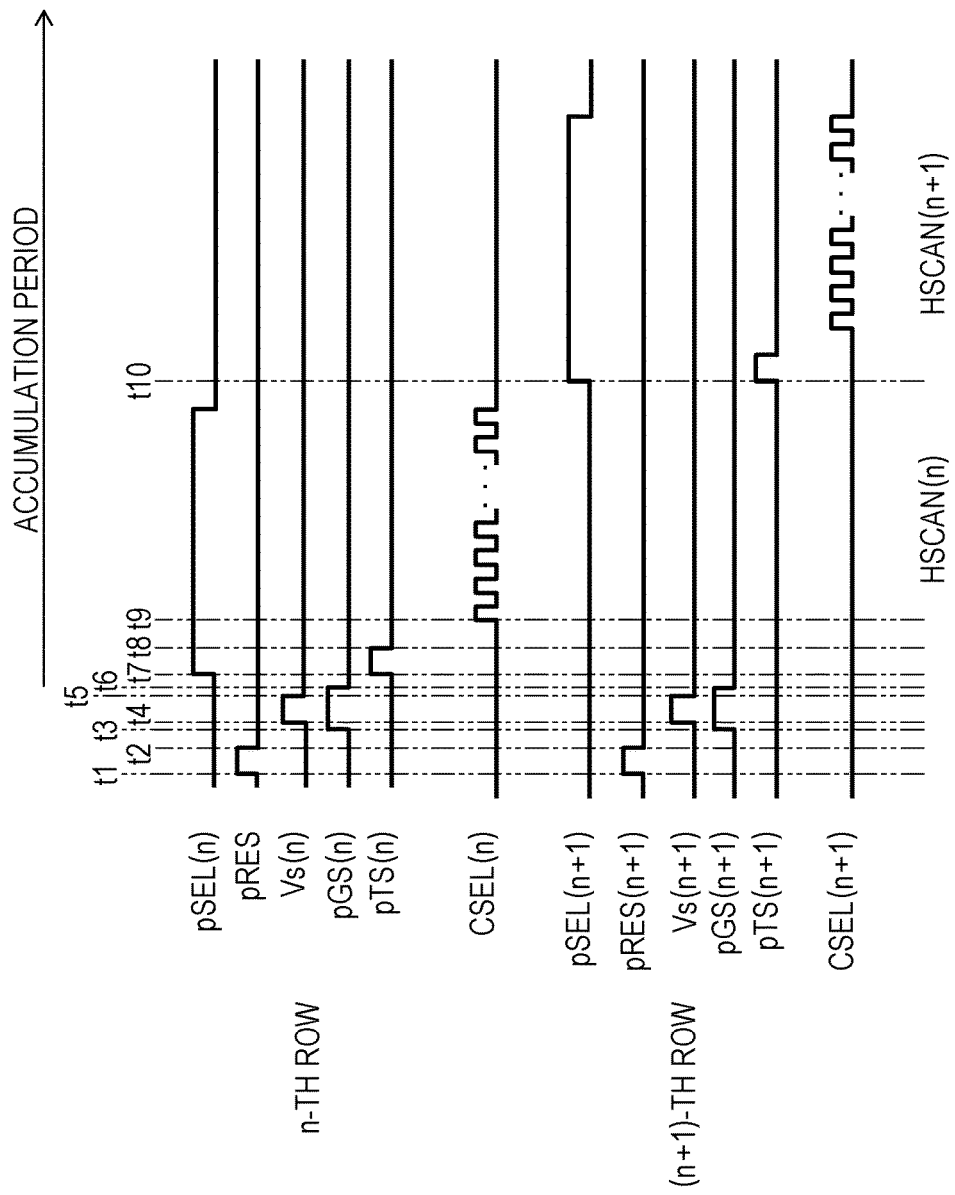
FIG. 17 is a diagram illustrating a timing chart of drive signals used in the photoelectric conversion device.

Next, a method for driving the photoelectric conversion device according to this exemplary embodiment will be described. FIG. 17 illustrates a timing chart of drive signals used in the photoelectric conversion device according to this exemplary embodiment. In FIG. 17, drive signals for signal readout for the n-th row and the (n+1)-th row, or two rows in total, are illustrated.

The difference from the driving method according to the third exemplary embodiment is that the voltage signal Vd is supplied to the nodes C illustrated in FIG. 16. In FIG. 17, the timing chart of the voltage signal Vd is illustrated. The voltage signal Vd includes the first voltage Vd1 and the second voltage Vd2. The period during which the voltage signal Vs is the first voltage Vs1 in the third exemplary embodiment corresponds to a period during which the voltage signal Vd is the first voltage Vd1 in this exemplary embodiment. The period during which the voltage signal Vs is the second voltage Vs2 in the third exemplary embodiment corresponds to a period during which the voltage signal Vd is the second voltage Vd2 in this exemplary embodiment.

The timing chart of the other drive signals is substantially the same as that in FIG. 15. Thus, a detailed description is not given here.

In this exemplary embodiment, in the manner described above, signal readout based on the global electronic shutter operation is achieved. In this exemplary embodiment, furthermore, the drive signals illustrated in FIG. 7 may be supplied while the drive signal pGS is kept at a high level. This enables signal readout based on the rolling shutter operation in a way similar to that in the first exemplary embodiment.

Also in this exemplary embodiment, the photoelectric conversion layer 205 includes the quantum dots 10. Thus, a noise reduction effect may be achieved.

Fifth Exemplary Embodiment

Another exemplary embodiment will be described. This exemplary embodiment is different from the first exemplary embodiment to the fourth exemplary embodiment in that each pixel includes a clamp circuit connected downstream of the amplification unit. Thus, only portions different from the first exemplary embodiment to the fourth exemplary embodiment are described. Portions that are substantially the same as those in any of the first exemplary embodiment to the fourth exemplary embodiment are not described.

Figure 18:
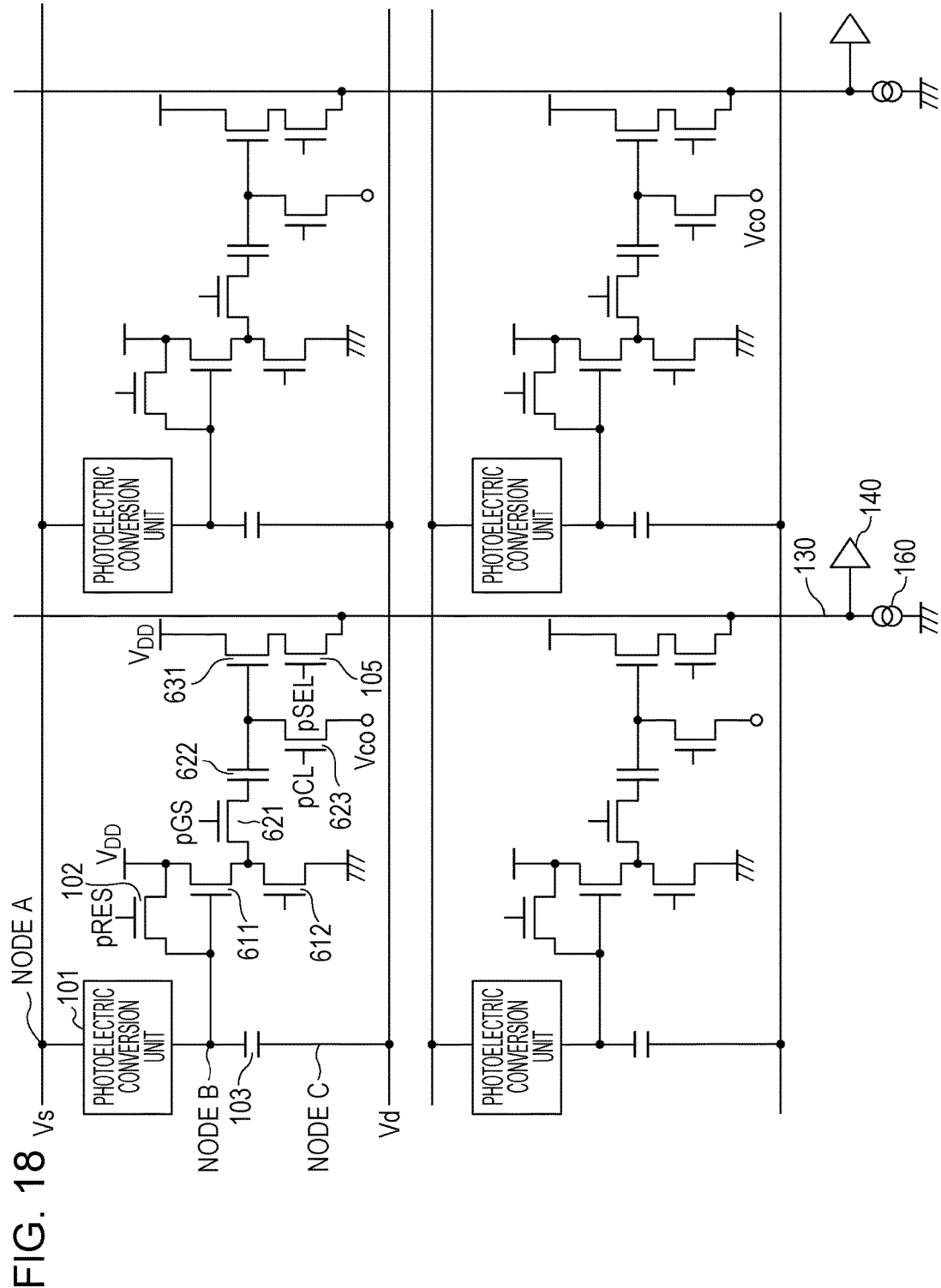
FIG. 18 is a schematic diagram of the configuration of a pixel of a photoelectric conversion device according to a fifth exemplary embodiment.

FIG. 18 schematically illustrates the configuration of pixels 100 of a photoelectric conversion device according to this exemplary embodiment. In FIG. 18, four pixels 100 arranged in two rows and two columns are illustrated. Portions having substantially the same functions as those in FIG. 1A are assigned the same numerals. Each of the photoelectric conversion units 101 has a structure similar to that in any of the first to fourth exemplary embodiments. Thus, the cross-sectional structure of the photoelectric conversion units 101 is not illustrated in FIG. 18.

In this exemplary embodiment, each of the pixels 100 includes two amplification units. A first amplification unit is a source follower circuit including a first amplifier transistor 611 and a current source 612. A second amplification unit includes a second amplifier transistor 631. The second amplifier transistor 631 is connected to the output line 130 via the selection transistor 105. The second amplifier transistor 631 and the current source 160 connected to the output line 130 constitute a source follower circuit.

Each of the pixels 100 further includes a clamp circuit for implementing a global electronic shutter. The clamp circuit includes a clamp switch 621, a clamp capacitor 622, and a clamp voltage supply switch 623. The clamp switch 621 is disposed in an electrical path between the node B to which the first capacitor 103 is connected and an input node of the second amplification unit of the pixel 100. A drive signal pGS is supplied to the clamp switch 621. A drive signal pCL is supplied to the clamp voltage supply switch 623.

The clamp circuit clamps the noise signal output from the first amplification unit. After that, the first amplification unit outputs an optical signal. Thus, the clamp circuit is capable of removing noise such as reset noise included in the optical signal. This configuration enables implementation of a global electronic shutter operation while removing random noise such as reset noise.

Figure 19:
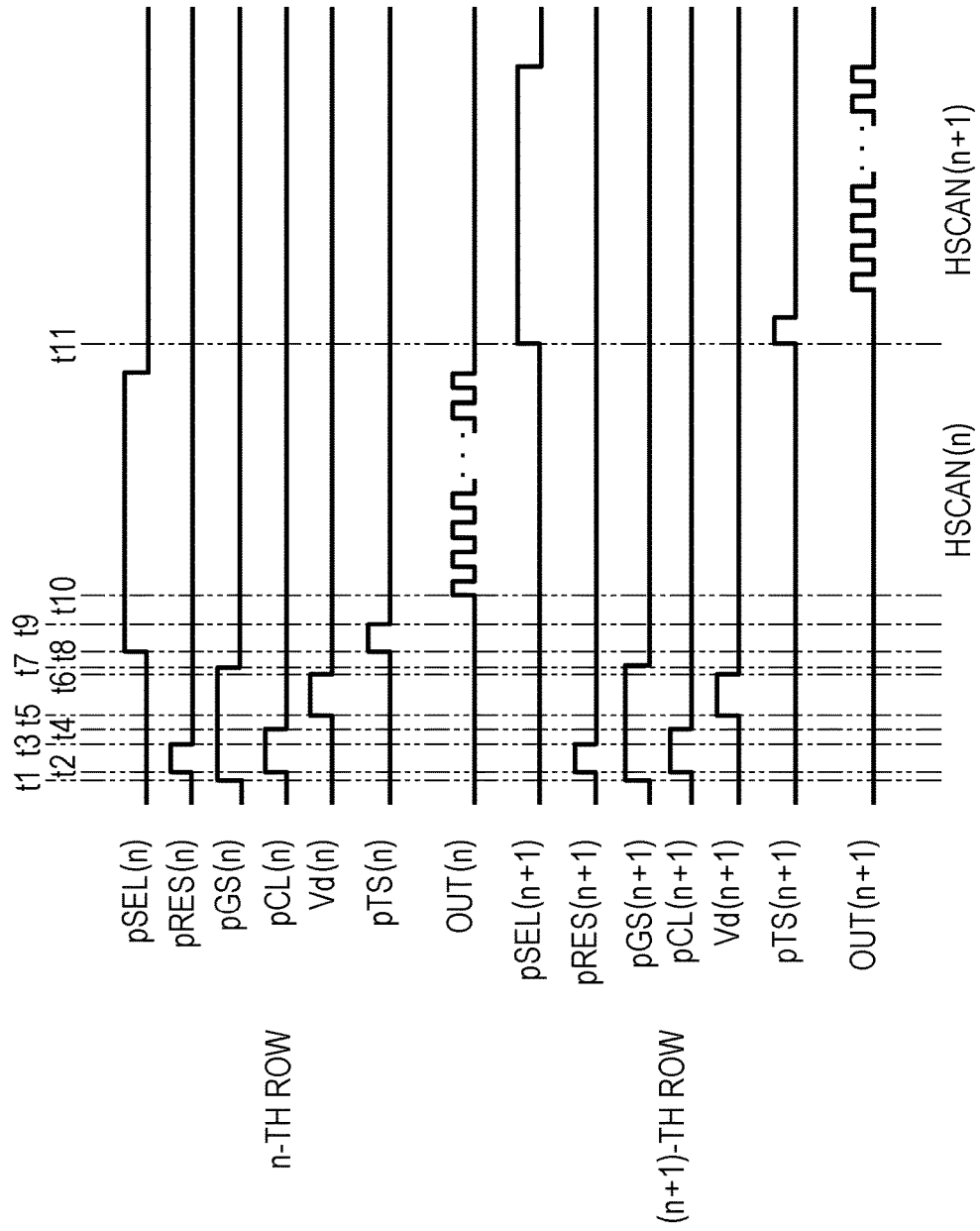
FIG. 19 is a diagram illustrating a timing chart of drive signals used in the photoelectric conversion device.

Next, a method for driving the photoelectric conversion device according to this exemplary embodiment will be described. FIG. 19 illustrates a timing chart of drive signals used in the photoelectric conversion device according to this exemplary embodiment. In FIG. 19, drive signals for signal readout for the n-th row and the (n+1)-th row, or two rows in total, are illustrated.

The difference from the driving method according to the first exemplary embodiment is that the drive signal pGS is supplied to the switch 501. In FIG. 19, the timing chart of the voltage signal Vd is illustrated. When a drive signal is in high level, the corresponding switch is turned on. When a drive signal is in low level, the corresponding switch is turned off.

At time t1, the drive signal pGS(n) and the drive signal pGS(n+1) rise to a high level. At time t2, the drive signal pRES(n) and the drive signal pRES(n+1) rise to a high level. At time t2, furthermore, the drive signal pCL(n) and the drive signal pCL(n+1) also rise to a high level. After that, at time t3, the drive signal pRES(n) and the drive signal pRES(n+1) fall to a low level. At time t4, the drive signal pCL(n) and the drive signal pCL(n+1) fall to a low level. Accordingly, the clamp circuits of the pixels 100 in the n-th row and the (n+1)-th row clamp the noise signals.

Subsequently, in the period from time t5 to time t6, the voltage signal Vd(n) and the voltage signal Vd(n+1) are the second voltage Vd2. Thus, the accumulated signal charge is transferred. Since the clamp switch 621 is in an on state, a voltage Vp corresponding to the amount of signal charge is generated in the clamp capacitor 622.

After that, at time t7, the drive signal pGS(n) and the drive signal pGS(n+1) fall to a low level. Accordingly, the clamp circuits of the pixels 100 are electrically separated from the photoelectric conversion units 101.

In the subsequent operation, optical signals are read out row-by-row. This operation is substantially the same as that in the third exemplary embodiment or the fourth exemplary embodiment, and is not described herein.

Through the operation described above, a global electronic shutter operation is implemented. In this exemplary embodiment, furthermore, each of the pixels 100 includes a clamp circuit. This configuration enables a reduction in random noise such as reset noise.

Sixth Exemplary Embodiment

Another exemplary embodiment will be described. This exemplary embodiment is different from the first exemplary embodiment to the fifth exemplary embodiment in that each pixel includes a sample-and-hold circuit connected downstream of the amplification unit. Thus, only portions different from the first exemplary embodiment to the fifth exemplary embodiment are described. Portions that are substantially the same as those in any of the first exemplary embodiment to the fifth exemplary embodiment are not described.

Figure 20:
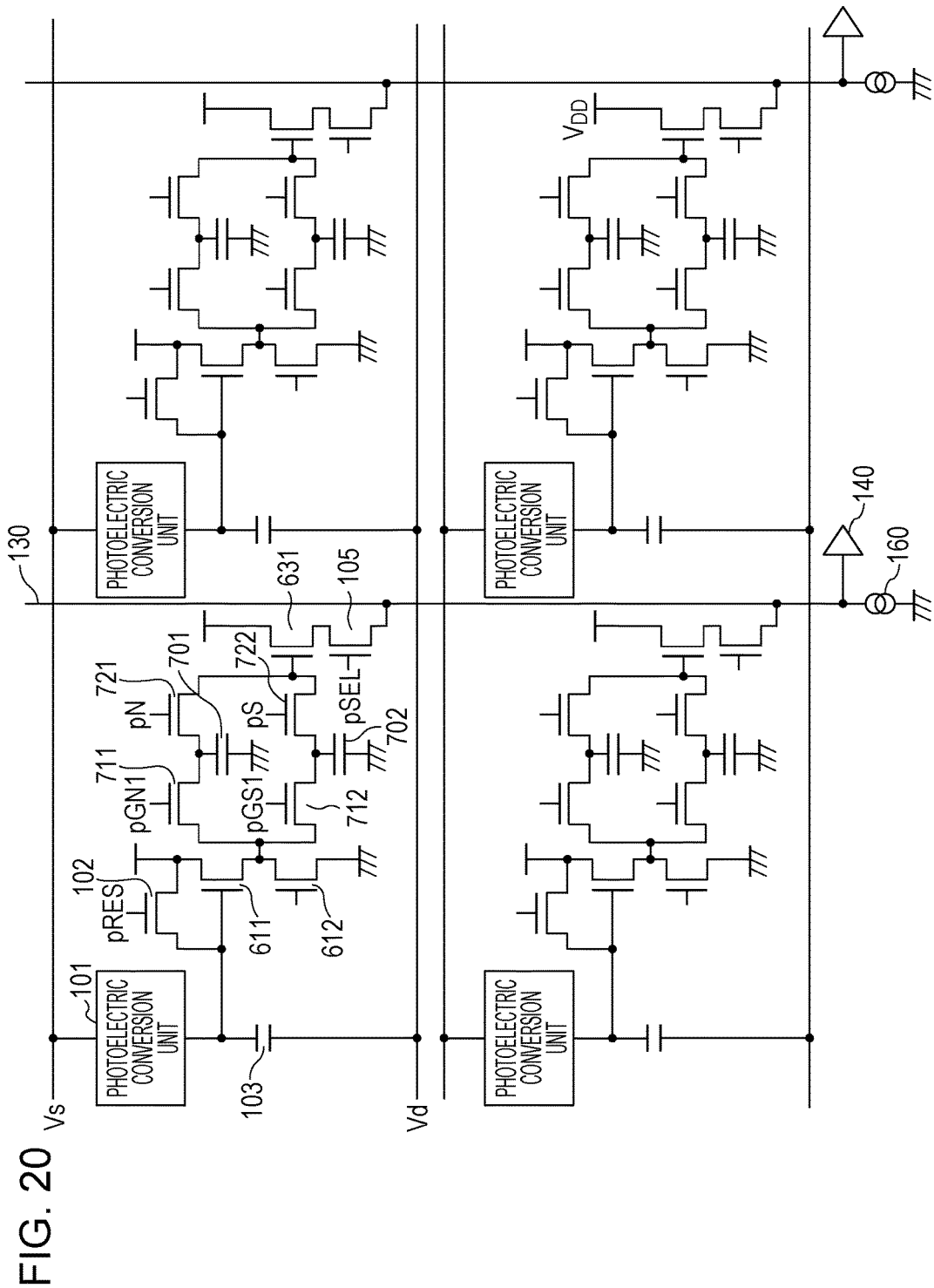
FIG. 20 is a schematic diagram of the configuration of a pixel of a photoelectric conversion device according to a sixth exemplary embodiment.

FIG. 20 schematically illustrates the configuration of pixels 100 of a photoelectric conversion device according to this exemplary embodiment. In FIG. 20, four pixels 100 arranged in two rows and two columns are illustrated. Portions having substantially the same functions as those in FIG. 1A or FIG. 18 are assigned the same numerals. Each of the photoelectric conversion units 101 has a structure similar to that in any of the first to fifth exemplary embodiments. Thus, the cross-sectional structure of the photoelectric conversion units 101 is not illustrated in FIG. 20.

In this exemplary embodiment, each of the pixels 100 includes two amplification units. A first amplification unit is a source follower circuit including the first amplifier transistor 611 and the current source 612. A second amplification unit includes the second amplifier transistor 631. The second amplifier transistor 631 is connected to the output line 130 via the selection transistor 105. The second amplifier transistor 631 and the current source 160 connected to the output line 130 constitute a source follower circuit.

Each of the pixels 100 further includes a sample-and-hold circuit (hereinafter referred to as an "S/H circuit") for implementing a global electronic shutter. The pixel 100 includes a noise signal S/H circuit and an optical signal S/H circuit. The noise signal S/H circuit holds a noise signal output from the first amplification unit. The optical signal S/H circuit holds an optical signal output from the first amplification unit. The noise signal S/H circuit includes a capacitor 701, a first switch 711, and a second switch 721. The optical signal S/H circuit includes a capacitor 702, a first switch 712, and a second switch 722.

This configuration enables implementation of a global electronic shutter operation while removing random noise such as reset noise.

A driving method according to this exemplary embodiment will now be described. A description will be given here of only the driving of the S/H circuits for performing a global electronic shutter operation.

First, the first switches 711 of the noise signal S/H circuits in the pixels 100 in all rows are turned on in the state where input nodes of the first amplification units are reset. Accordingly, noise signals are held in the capacitors 701. Then, a signal charge transfer operation is performed. This operation is similar to that in any of the first exemplary embodiment to the fourth exemplary embodiment. Then, the first switches 712 of the optical signal S/H circuits in the pixels 100 in all rows are turned on. Accordingly, optical signals are held in the capacitors 702. After that, the second switches 721 and 722 are turned on row-by-row. Accordingly, signals from the pixels 100 are read out row-by-row. The signals output from the pixels 100 are held in the column circuits 140 in the way similar to that in the first exemplary embodiment, and are subjected to a subtraction process to remove noise.

Through the operation described above, a global electronic shutter operation is implemented. In this exemplary embodiment, furthermore, each of the pixels 100 includes a sample-and-hold circuit. This configuration enables a reduction in random noise such as reset noise.

Seventh Exemplary Embodiment

Figure 22:
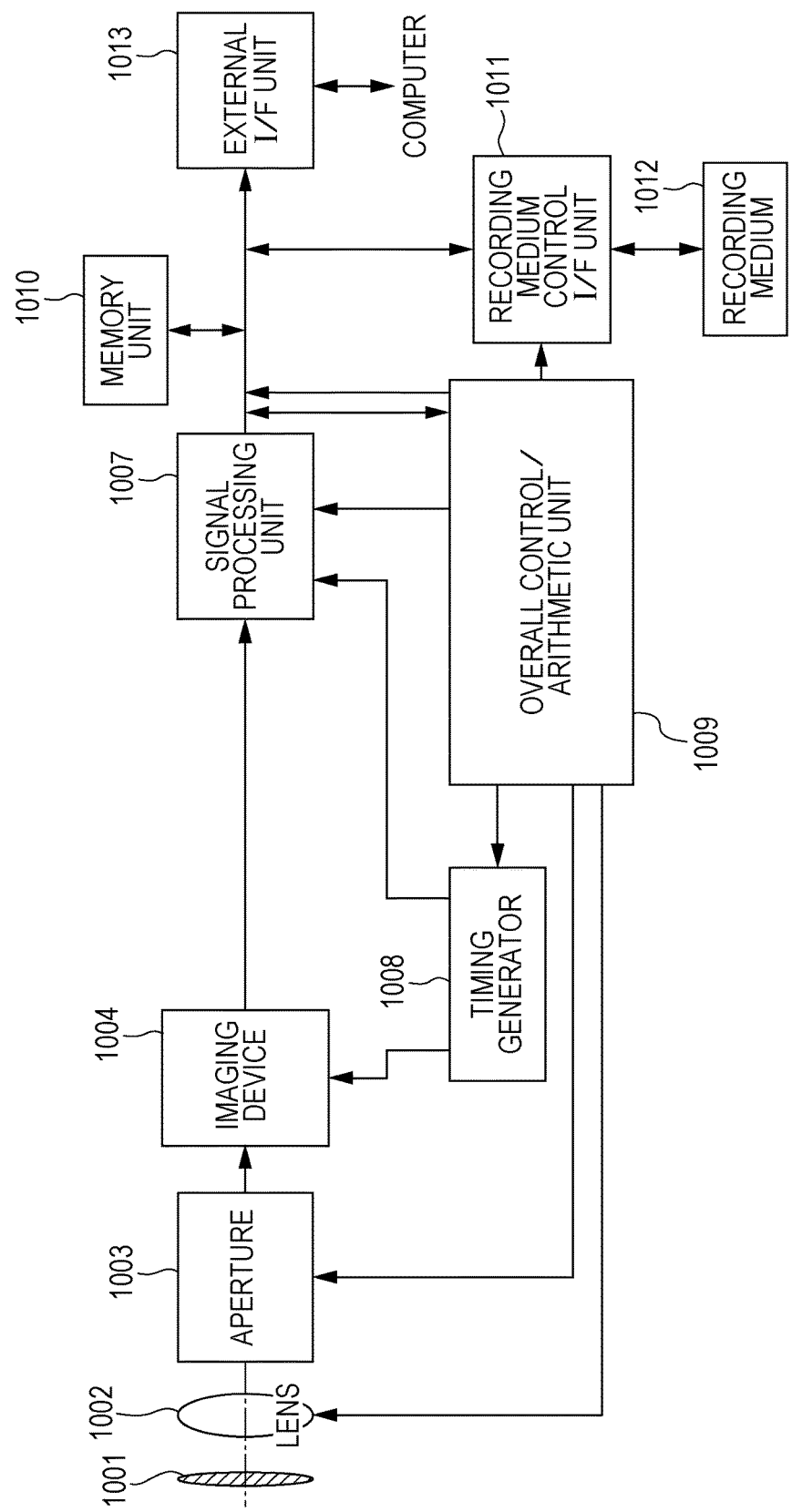
FIG. 22 is a block diagram of an imaging system according to a seventh exemplary embodiment.

An imaging system according to an exemplary embodiment of the present invention will be described. Examples of the imaging system include a digital still camera, a digital camcorder, a video head, a copying machine, a facsimile machine, a mobile phone, a vehicle-mountable camera, and an observation satellite. FIG. 22 is a block diagram of a digital still camera as an example of the imaging system.

Referring to FIG. 22, the digital still camera includes the following components. A barrier 1001 is configured to protect a lens 1002. The lens 1002 is configured to form an optical image of an object on a photoelectric conversion device (or an imaging device) 1004. An aperture 1003 is capable of changing the amount of light transmitted through the lens 1002. The photoelectric conversion device 1004 is any of the photoelectric conversion devices described above in the foregoing exemplary embodiments, and is configured to convert the optical image formed by the lens 1002 into image data. By way of example, an analog-to-digital (AD) conversion unit is formed on the semiconductor substrate of the photoelectric conversion device 1004. A signal processing unit 1007 is configured to perform various kinds of correction on imaging data output from the photoelectric conversion device 1004 and to compress the data. A timing generator 1008 outputs various timing signals to the photoelectric conversion device 1004 and the signal processing unit 1007. An overall control unit (or an overall control/arithmetic unit) 1009 is configured to control the overall digital still camera. A frame memory unit 1010 is configured to temporarily store image data. A recording medium control interface (I/F) unit 1011 is an interface unit for recording or reading data on or from a recording medium 1012. The recording medium 1012 is a removable recording medium, such as a semiconductor memory, on or from which the imaging data is recorded or read. An external interface (I/F) unit 1013 is an interface unit configured to communicate with an external computer or a similar device. The timing signals and the like may be input from a device outside the imaging system. It may be sufficient that the imaging system includes at least the photoelectric conversion device 1004, and the signal processing unit 1007 to process an imaging signal output from the photoelectric conversion device 1004.

In this exemplary embodiment, a configuration has been described in which the photoelectric conversion device 1004 and the AD conversion unit are disposed on separate semiconductor substrates. Alternatively, the photoelectric conversion device 1004 and the AD conversion unit may be formed on the same semiconductor substrate. The photoelectric conversion device 1004 and the signal processing unit 1007 may also be formed on the same semiconductor substrate.

Alternatively, each of the pixels 100 may be configured to include a first photoelectric conversion unit 101A and a second photoelectric conversion unit 101B. The signal processing unit 1007 may be configured to process a signal based on the electric charge generated by the first photoelectric conversion unit 101A and a signal based on the electric charge generated by the second photoelectric conversion unit 101B, and to obtain information on the distance from the photoelectric conversion device 1004 to the object.

In an imaging system according to an exemplary embodiment, the photoelectric conversion device 1004 is implemented as the photoelectric conversion device according to any of the first exemplary embodiment to the sixth exemplary embodiment. In the manner described above, by applying an exemplary embodiment of the present invention, an imaging system may obtain a noise-reduced image.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-156791, filed Jul. 31, 2014, which is hereby incorporated by reference herein in its entirety.

What is claimed is:

1. A photoelectric conversion device comprising:
a first pixel and a second pixel,
each of the first pixel and the second pixel including
a photoelectric conversion unit, and
an amplification unit configured to output a signal generated by the photoelectric conversion unit,
the photoelectric conversion unit including a first electrode and a second electrode,
wherein the photoelectric conversion device further includes:
a photoelectric conversion layer including quantum dots; and
an insulating layer disposed on the second electrode of the first pixel and the second electrode of the second pixel,
wherein the photoelectric conversion layer extends to a first region from a second region, the first region being a region between the first electrode of the first pixel and the insulating layer disposed on the second electrode of the first pixel, and the second region being a region between the first electrode of the second pixel and the insulating layer disposed on the second electrode of the second pixel, and
wherein the first region and the second region are disposed in a same layer.

2. The photoelectric conversion device according to claim 1, wherein the photoelectric conversion layer further includes a member formed of a material different from a material of the quantum dots, and
wherein the quantum dots are dispersed in the member.

3. The photoelectric conversion device according to claim 2, wherein the material of the member has a larger band gap than the material of the quantum dots.

4. The photoelectric conversion device according to claim 2, wherein the material of the quantum dots absorbs light having a longer wavelength than light having a longest wavelength that the material of the member absorbs.

5. The photoelectric conversion device according to claim 1, wherein the photoelectric conversion layer further includes a cover layer configured to cover the quantum dots, and
wherein a material of the cover layer has a larger band gap than a material of the quantum dots.

6. The photoelectric conversion device according to claim 1, wherein the photoelectric conversion layer further includes a cover layer configured to cover the quantum dots, and
wherein a material of the quantum dots absorbs light having a longer wavelength than light having a longest wavelength that a material of the cover layer absorbs.

7. The photoelectric conversion device according to claim 1, wherein the photoelectric conversion layer further includes a buried layer in which the quantum dots are buried, and
wherein a material of the buried layer has a larger band gap than a material of the quantum dots.

8. The photoelectric conversion device according to claim 1, wherein the photoelectric conversion layer further includes a buried layer in which the quantum dots are buried, and
wherein a material of the quantum dots absorbs light having a longer wavelength than light having a longest wavelength that a material of the buried layer absorbs.

9. The photoelectric conversion device according to claim 1, wherein the quantum dots include a quantum dot having a particle size in a range of 1 nm to 20 nm.

10. The photoelectric conversion device according to claim 1, wherein the photoelectric conversion layer further includes a shell configured to surround the quantum dots.

11. The photoelectric conversion device according to claim 10, wherein a ratio of a lattice constant of a material of the quantum dots to a lattice constant of a material of the shell member is in a range of 0.9 to 1.1.

12. The photoelectric conversion device according to claim 1, wherein the quantum dots are formed of a material selected from the group consisting of PbS, PbSe, PbTe, CdS, CdSe, CdTe, C, Si, and Ge.

13. A photoelectric conversion device comprising:
a first pixel and a second pixel,
each of the first pixel and the second pixel including
a photoelectric conversion unit, and
an amplification unit configured to output a signal generated by the photoelectric conversion unit,
the photoelectric conversion unit including a first electrode and a second electrode,
wherein the photoelectric conversion device further includes:
a photoelectric conversion layer including a first member, and a plurality of particles arranged in the first member and having a particle size in a range of 1 nm to 20 nm; and
an insulating layer disposed on the second electrode of the first pixel and the second electrode of the second pixel,
wherein the photoelectric conversion layer extends to a first region from a second region, the first region being a region between the first electrode of the first pixel and the insulating layer disposed on the second electrode of the first pixel, and the second region being a region between the first electrode of the second pixel and the insulating layer disposed on the second electrode of the second pixel, and
wherein the first region and the second region are disposed in a same layer.

14. The photoelectric conversion device according to claim 1, further comprising:
a reset unit configured to supply a reset voltage to the second electrode;
a first capacitor including a first terminal and a second terminal, the first terminal being electrically connected to the second electrode; and
a voltage supply unit configured to supply at least a first voltage and a second voltage different from the first voltage to the second terminal, wherein the amplification unit is electrically connected to the second electrode, and wherein the following relationship is satisfied:

$$\frac{C1}{C1+C2} > \frac{Vs - Vres}{Vd2 - Vd1},$$

where Vs denotes a voltage supplied to the first electrode, Vd1 denotes the first voltage, Vd2 denotes the second voltage, Vres denotes the reset voltage, C1 denotes a capacitance value of the first capacitor, and C2 denotes a capacitance value of a second capacitor formed by the first electrode and the second electrode.

15. The photoelectric conversion device according to claim 14, wherein the first voltage is supplied to the second terminal to accumulate signal charge in the photoelectric conversion layer, and wherein the second voltage is supplied to the second terminal to discharge the signal charge from the photoelectric conversion layer.

16. The photoelectric conversion device according to claim 1, further comprising:

a reset unit configured to supply a reset voltage to the second electrode;

a first capacitor electrically connected to the second electrode; and a voltage supply unit configured to supply at least a first voltage and a second voltage different from the first voltage to the first electrode, wherein the amplification unit is electrically connected to the second electrode, and wherein the following relationship is satisfied:

$$\frac{C1}{C2} > \frac{Vres - Vs1}{Vs2 - Vres},$$

where Vs1 denotes the first voltage, Vs2 denotes the second voltage, Vres denotes the reset voltage, C1 denotes a capacitance value of the first capacitor, and C2 denotes a capacitance value of a second capacitor formed by the first electrode and the second electrode.

17. The photoelectric conversion device according to claim 16, wherein the first voltage is supplied to the first electrode to accumulate signal charge in the photoelectric conversion layer, and wherein the second voltage is supplied to the first electrode to discharge the signal charge from the photoelectric conversion layer.

18. The photoelectric conversion device according to claim 14, wherein the first capacitor includes two electrodes facing each other.

19. An imaging system comprising:

the photoelectric conversion device according to claim 1; and a signal processing device configured to process a signal from the photoelectric conversion device.

20. The imaging system according to claim 19, wherein two photoelectric conversion units, each comprising the photoelectric conversion unit, are disposed for each pixel, and wherein the signal processing device processes a signal based on electric charge generated by the two photoelectric conversion units, and obtains information on a distance from the photoelectric conversion device to an object.

21. The photoelectric conversion device according to claim 1, wherein the insulating layer extends to a third region on the second electrode of the first pixel to a fourth region on the second electrode of the second pixel, and wherein the third region and the fourth region are disposed in a same layer.

22. The photoelectric conversion device according to claim 2, wherein the member extends to the first region from the second region.

23. The photoelectric conversion device according to claim 1, wherein the quantum dot is dispersed in a region between the first region and the second region.

24. The photoelectric conversion device according to claim 1, further comprising a first capacitor including a third electrode and a fourth electrode, the third electrode being electrically connected to the second electrode, wherein, in a planar view, a part of the third electrode is overlapped with a part of the second electrode.

25. The photoelectric conversion device according to claim 24, wherein, in a planar view, a part of the fourth electrode is overlapped with a part of the second electrode.

26. The photoelectric conversion device according to claim 25, further comprising a voltage supply unit configured to supply at least a first voltage and a second voltage different from the first voltage to the fourth electrode.

27. The photoelectric conversion device according to claim 26, wherein a relationship between a voltage of the first electrode and a voltage of the second electrode is a first relationship by suppling the first voltage from the voltage supply unit to the fourth electrode, and the relationship is a second relationship different from the first relationship by suppling the second voltage from the voltage supply unit to the fourth electrode.

* * * * *